United States Patent
Kishimoto

(10) Patent No.: US 7,339,967 B2
(45) Date of Patent: Mar. 4, 2008

(54) SEMICONDUCTOR DEVICE, SEMICONDUCTOR LASER DEVICE, MANUFACTURING METHOD FOR SEMICONDUCTOR DEVICE, MANUFACTURING METHOD FOR SEMICONDUCTOR LASER DEVICE, OPTICAL DISK DEVICE AND OPTICAL TRANSMISSION SYSTEM

(75) Inventor: Katsuhiko Kishimoto, Nara (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 323 days.

(21) Appl. No.: 11/050,289

(22) Filed: Feb. 4, 2005

(65) Prior Publication Data

US 2005/0176165 A1    Aug. 11, 2005

(30) Foreign Application Priority Data

Feb. 6, 2004    (JP)    ............................ P2004-030579
Dec. 8, 2004    (JP)    ............................ P2004-355636

(51) Int. Cl.
*H01S 5/00*    (2006.01)

(52) U.S. Cl. ............................... 372/46.01; 372/45.01; 372/44.01; 372/43.01

(58) Field of Classification Search ............. 372/46.01, 372/44.01, 43.01, 45.01
See application file for complete search history.

(56) References Cited

U.S. PATENT DOCUMENTS

| | | | | |
|---|---|---|---|---|
| 5,319,661 A | * | 6/1994 | Irikawa et al. ........... | 372/46.01 |
| 5,835,516 A | * | 11/1998 | Miyashita et al. ........ | 372/46.01 |
| 6,185,238 B1 | * | 2/2001 | Onomura et al. ........ | 372/46.01 |
| 6,819,697 B2 | * | 11/2004 | Widjaja et al. ......... | 372/46.013 |
| 2003/0026307 A1 | | 2/2003 | Makita et al. | |

FOREIGN PATENT DOCUMENTS

| JP | 62-23191 A | 1/1987 |
|---|---|---|
| JP | 4-329688 A | 11/1992 |
| JP | 10-144990 A | 5/1998 |
| JP | 2000-164986 A | 6/2000 |
| JP | 2001-94211 A | 4/2001 |
| JP | 2003-46197 A | 2/2003 |

* cited by examiner

*Primary Examiner*—Minsun Oh Harvey
*Assistant Examiner*—Kinam Park
(74) *Attorney, Agent, or Firm*—Birch, Stewart, Kolasch & Birch, LLP

(57) ABSTRACT

A semiconductor device has a main structure member laminated on a first conductivity-type semiconductor substrate. On the main structure, there is formed a first substructure member, the entirety of which, including lowermost layer, is second conductivity-type. On the main structure member, there is also formed a second substructure member spatially separated from the first substructure member. The second substructure member has a current block layer of a semiconductor layer on the second conductivity-type structure identical to the first substructure member. In the semiconductor device, there is further provided a p-side electrode formed on the first and second substructure members and between the first and second substructure members to connect therebetween.

15 Claims, 17 Drawing Sheets

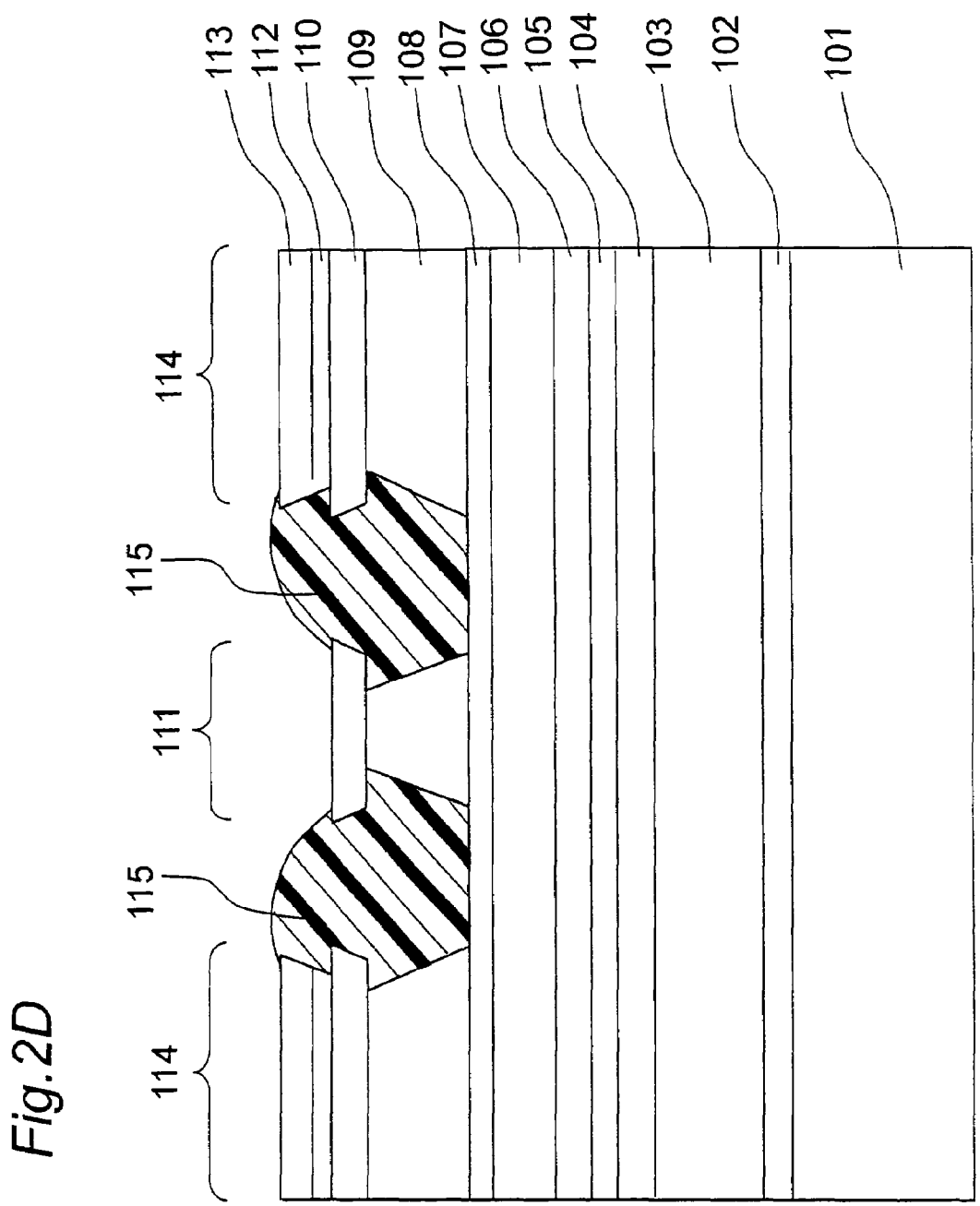

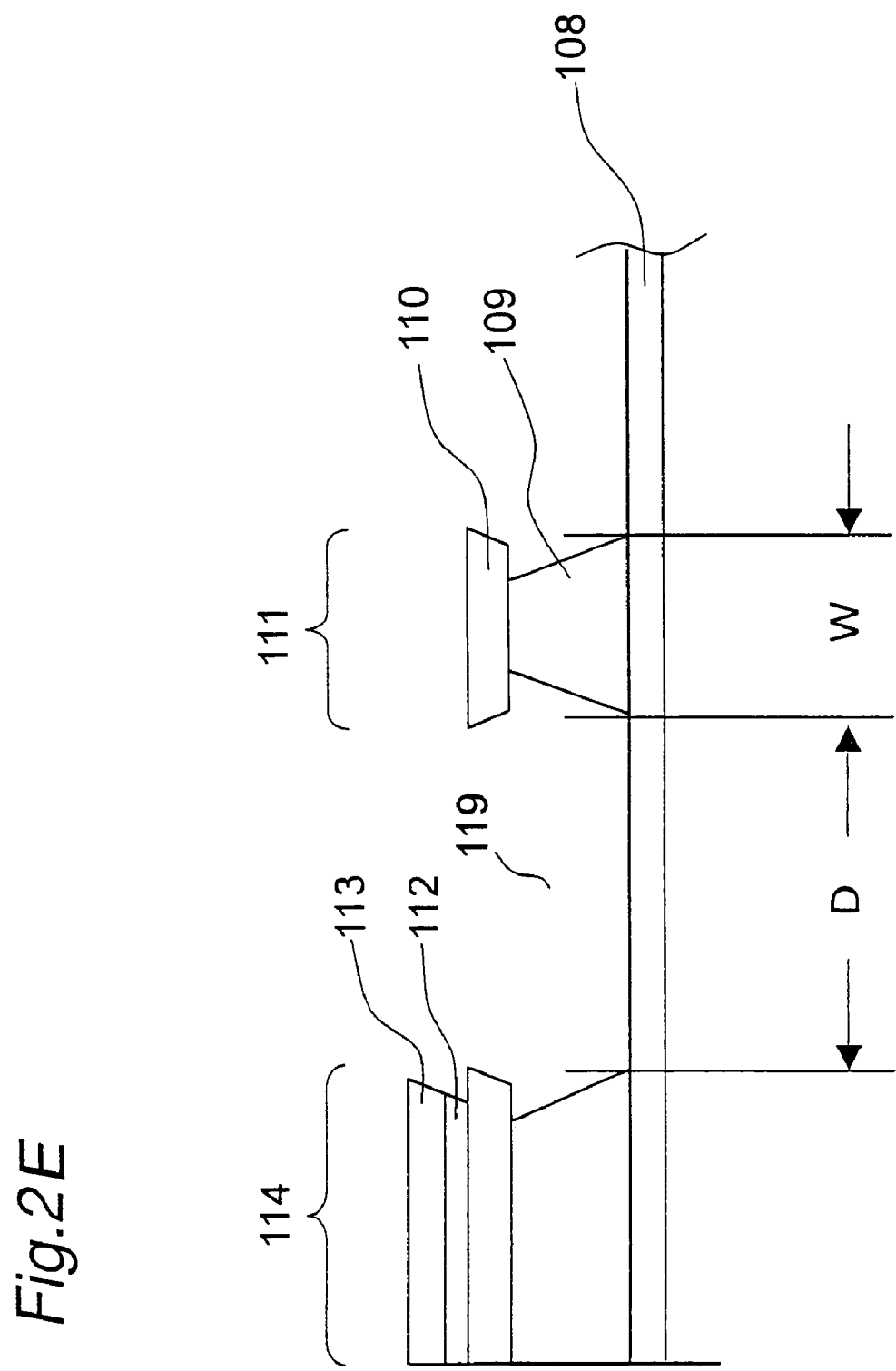

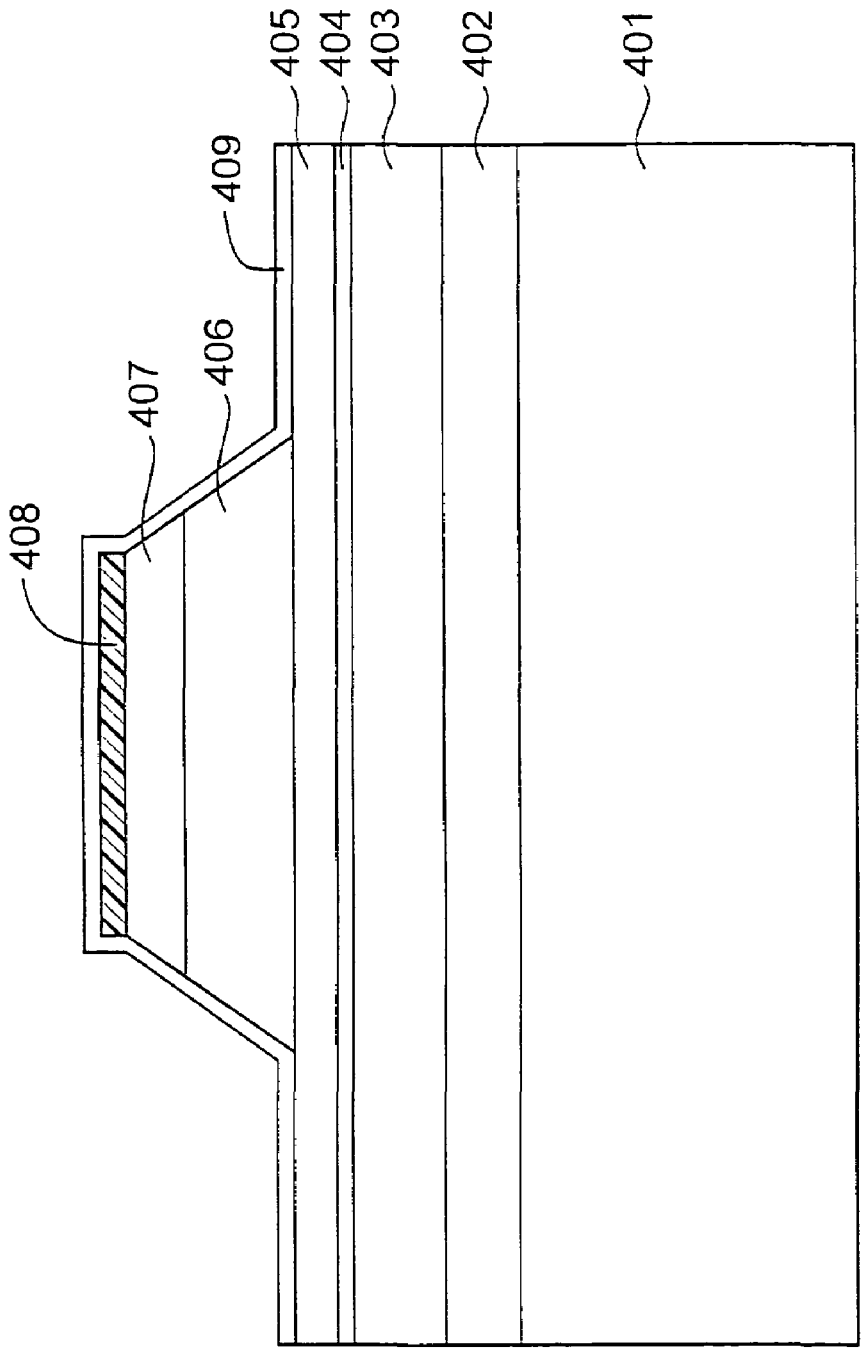

US 7,339,967 B2

SEMICONDUCTOR DEVICE, SEMICONDUCTOR LASER DEVICE, MANUFACTURING METHOD FOR SEMICONDUCTOR DEVICE, MANUFACTURING METHOD FOR SEMICONDUCTOR LASER DEVICE, OPTICAL DISK DEVICE AND OPTICAL TRANSMISSION SYSTEM

CROSS-REFERENCE TO RELATED APPLICATIONS

This nonprovisional application claims priority under 35 U.S.C. 119 (a) on Patent Application No. 2004-030579 filed in Japan on Feb. 6, 2004 and Patent Application No. 2004-355636 filed in Japan on Dec. 8, 2004, the entire contents of which are incorporated herein by reference.

BACKGROUND OF THE INVENTION

The present invention relates to a semiconductor device, a semiconductor laser device, a manufacturing method for the semiconductor device, a manufacturing method for the semiconductor laser device, an optical disk device and an optical transmission system, and more particularly relates to a semiconductor laser device for use in an optical disk device and an optical transmission system and a manufacturing method therefor.

Conventionally, the buried ridge type of semiconductor laser device is in heavy usage since it has a structure having both reliability and properties. The buried ridge-type semiconductor laser device requires a plurality of crystal growth processes. Such crystal growth processes have been a large obstacle in reduction of manufacturing cost of the semiconductor laser device. This leads to development of an element production method where the buried-type crystal growth is omitted and the semiconductor laser device is produced in one crystal growth. In particular, there has been developed an element where a ridge waveguide structure is formed, and current narrowing and optical confinement are performed by using silicon oxide ($SiO_2$) and silicon nitride ($SiN_x$). An example of the conventional manufacturing method for the ridge waveguide semiconductor laser device is shown in FIG. 6A to FIG. 6E (see JP 62-23191 A for example).

In FIG. 6A to FIG. 6E, there are shown an n-type GaAs substrate 401, an n-type GaAs buffer layer 402, an n-type $Al_{0.43}Ga_{0.57}As$ lower cladding layer 403, an undoped n-$Al_{0.11}Ga_{0.89}As$ active layer 404, a p-type $Al_{0.43}Ga_{0.57}As$ first upper cladding layer 405, a p-type $Al_{0.25}Ga_{0.75}As$ second upper cladding layer 406, a contact layer 407, a resist film 408, an $SiO_2$ insulating film 409, a p-side electrode 410 and an n-side electrode 411.

Description is hereinbelow given of a manufacturing method for the semiconductor laser device. First, as shown in FIG. 6A, the buffer layer 402, the lower cladding layer 403, the active layer 404, the first upper cladding layer 405, the second upper cladding layer 406 and the contact layer 407 are each grown in sequence on the n-type GaAs substrate by using any one of crystal growth methods including a liquid phase growth method, a vapor growth method and a molecular beam epitaxy (MBE) method. Next, as shown in FIG. 6B, the resist film 408 is formed into a stripe shape by photolithographic technique. Next, a ridge structure is formed by using an etchant which selectively etches only the second upper cladding layer 406. Such an etchant may include an $NH_3/H_2O_2$ solution. A solution of $NH_4OH$:$H_2O_2$=20:1 has composition dependence on the etching rate of $Al_yGa_{1-y}As$, as shown in FIG. 7. In FIG. 7, the horizontal axis represents a value of y in $Al_yGa_{1-y}As$, while the vertical axis represents an etching rate (μm/min)

Therefore, selective etching can be easily performed by using this etchant, so that a ridge portion is formed as shown in FIG. 6C. Next, as shown in FIG. 6D, the insulating film 409 is formed in the state that the resist film 408 remains. Then, the insulating film 409 on the ridge portion is removed together with the resist film 408 by lift-off process. Thereafter, the p-side electrode 410 and the n-side electrode 411 are formed on the upper face of the contact layer 407 and the lower face of the n-type GaAs substrate 401 respectively, by evaporation for ohmic contact. Through these steps, a ridge waveguide semiconductor laser device shown in FIG. 6E is obtained.

According to the above-stated conventional manufacturing method for the semiconductor laser device, without execution of a plurality of the crystal growth processes, there can be manufactured a ridge waveguide semiconductor laser device with an insulating film formed on an upper portion excluding the upper face of the ridge portion.

However, this conventional ridge waveguide semiconductor laser device using the above-stated insulating film had a following problem. Specifically, most of the p-side electrode on the side of the ridge portion is formed on the insulating film. An electrically conductive material constituting the p-side electrode is generally poor in adhesion to the insulating film. Therefore, there is the problem that, when a thick electrode is formed, stress thereof tends to detach the electrode from the insulating film along the interface between the insulating film and the electrode made of the conductive material. In the case of the above-described structure of the ridge waveguide semiconductor laser device, it is necessary to form the conductive material above a certain film thickness in order to prevent the conductive material from suffering step-like breakage due to a step portion of the ridge portion. Therefore, the problem of stress caused by thick material is unavoidable. Further, there is also a possibility that the electrode made of the conductive material may be detached from the insulating film along the interface therebetween in the process of bonding a metal wire to the p-side electrode for feeding current to the semiconductor laser device. This is because adhesion is weak between the conductive material of the electrode and the insulating film when ultrasonic wave or heat is generally applied to fix the metal wire to the electrode during the bonding process. If intensity of ultrasonic wave or heating is restrained in order to prevent the detachment, there is arisen a new problem of decrease in fixing strength (i.e. bonding strength) of the metal wire.

SUMMARY OF THE INVENTION

An object of the present invention is to provide a semiconductor device which can overcome the above-stated problems, i.e., which can be manufactured in one crystal growth process and in which detachment along the interface between a conductive material and an insulating material is restrained so as to allow manufacturing with sufficient yield at low cost, as well as a manufacturing method therefore, a semiconductor laser device and a manufacturing method therefor.

Another object of the present invention is to provide an optical disk device and an optical transmission system with use of the above-stated semiconductor laser device manufactured at low cost and has improved yield.

In order to achieve the above-mentioned object, the present invention provides a semiconductor device, comprising:

a main structure member laminated on a first conductivity-type semiconductor substrate;

a first substructure member which is formed on the main structure member and whose entire region including a lowermost layer is a second conductivity-type semiconductor layer;

a second substructure member which is formed on the main structure member in the state of being spatially separated from the first substructure member and which has a portion sharing a structure with the first substructure member and a current block layer comprising a semiconductor layer provided on the portion; and a conductive material which is formed on the first and second substructure members such that the first and second substructure members are connected.

The term "main structure member" herein refers to a structure member including an essential structure for the semiconductor device to fulfill its original function, e.g., an active layer in the case of a semiconductor laser device and a channel layer in the case of a field effect transistor. Also, the term "first conductivity type" herein refers to either one of conductivity types of an n type and a p-type, while the term "second conductivity type" refers to the other conductivity type among the n type and the p type.

According to the above-structured semiconductor device, the first substructure member and the second substructure member formed on the main structure member share a portion of the second substructure member excluding the current block layer. The current block layer is also formed from a semiconductor layer. Therefore, the semiconductor device can be manufactured in one crystal growth process. Moreover, it becomes possible to support the conductive material with sufficient adhesion, thereby making it possible to improve manufacturing yield. Specifically, by forming the current block layer is formed as, for example, a semiconductor layer of a first conductivity type or a semiconductor layer of a second conductivity type with doping concentration of not more than $1\times10^{17}$ cm$^{-3}$, the conductive material is directly formed on the semiconductor material in the region other than a space between the first and second substructure members. Thereby, the interface between the conductive material and the semiconductor material has adhesion better than that of the interface between the conductive material and the insulating film material, so that the detachment problem during manufacturing process can be suppressed.

In one embodiment of the present invention, the semiconductor device is preferably a semiconductor laser device in which the main structure member has an active layer and the first substructure member is a ridge portion.

According to the semiconductor laser device in the embodiment, the first substructure member forming the ridge portion and the second substructure member share a second conductivity-type semiconductor layer portion excluding the current block layer. Also, the current block layer is structured from a semiconductor layer. These allow manufacturing of the semiconductor laser device in one crystal growth process and allow provision of the inexpensive semiconductor laser device, thereby making it possible to provide the semiconductor laser device having both sufficient property and manufacturing yield.

In one embodiment of the present invention, the current block layer is preferably the first conductivity-type semiconductor layer.

According to the semiconductor laser device in the embodiment, it becomes possible to easily and sequentially form the first conductivity-type semiconductor layer becoming the current block layer on the second substructure member in the crystal growth process, and moreover, the current block layer is formed to have a conductivity type opposite to the type of a semiconductor layer group of the second conductivity type serving as a base. Therefore, it is possible to achieve a high current block characteristic without formation of a separate insulating film.

In one embodiment of the present invention, preferably, the current block layer is the second conductivity-type semiconductor layer, and the second conductivity-type semiconductor layer has a doping concentration of not more than $1\times10^{17}$ cm$^{-3}$.

According to the semiconductor laser device in the embodiment, since the second conductivity-type semiconductor layer with doping concentration of not more than $1\times10^{17}$ cm$^{-3}$ is used as the current block layer, it becomes possible to easily and sequentially form the current block layer having the high current blocking characteristic on the second substructure member in the crystal growth process. This allows provision of the semiconductor laser device which can be manufactured with sufficient yield at low cost without the necessity of forming a separate insulating film.

In one embodiment of the present invention, preferably, a first etching stop layer is formed in an uppermost portion of the main structure member, and the second conductivity-type semiconductor layer formed in the lowermost layer of the first and second substructure members allows selective etching against the first etching stop layer.

According to the semiconductor laser device in the embodiment, the first substructure member and the second substructure member can be formed with sufficient controllability. Thereby, manufacturing yield is improved. Also, a height of the first substructure member and a thickness of the main structure member, which influence an optical confinement characteristic of the semiconductor laser device, can be controlled at the level of the crystal growth. Thereby, desired element characteristics can be easily obtained.

In one embodiment of the present invention, preferably, the second substructure member has a second etching stop layer of a second conductivity-type semiconductor under the current block layer, and the current block layer allows selective etching against the second conductivity-type second etching stop layer.

According to the semiconductor laser device in the embodiment, by executing selective etching of the current block layer against the second conductivity-type second etching stop layer, it becomes possible to easily and controllably expose the second conductivity-type semiconductor layer which is located in the uppermost portion of the first substructure member and constitutes a contact layer of the ridge portion. This brings about effects of improving yield during manufacturing and stabilizing the element characteristics.

In one embodiment of the present invention, $D \geqq W$ is preferably satisfied, where a width of the first substructure member is W, and a distance between the first substructure member and the second substructure member is D.

According to the semiconductor laser device of the embodiment, when $D \geqq W$ is satisfied, by a general etching technique regardless of a dry or wet method, it is possible to easily remove the semiconductor layer laminated between the first and second substructure members so that the first and second substructure members are separated. Further, when the second substructure member is formed away from the first substructure member to satisfy D≧W, it becomes possible to prevent the second substructure member from exerting any harmful influence over optical distribution characteristics of laser light oscillated immediately under the first substructure member. This brings about an effect of simplifying element design to obtain the semiconductor laser device having desired optical characteristics.

In one embodiment of the present invention, a space between the first and second substructure members is preferably filled with an insulator.

According to the semiconductor laser device in the embodiment, the side face of the first substructure member constituting the ridge portion, the upper surface of the first etching stop layer and the side face of the second substructure member are coated with the insulator, which brings about effects of preventing moisture adsorption and oxidation and improving element reliability. Moreover, the conductive material forming an electrode does not directly contacts the side of the first substructure member or the first etching stop layer. Thereby, absorption loss of oscillated laser light due to the conductive material is decreased, therefore, which brings about effects of increasing efficiency of the semiconductor laser device and implementing low threshold current.

In one embodiment of the present invention, preferably, a height of the insulator is higher than that of the first substructure member and a height of at least a part of the insulator is higher than that of the second substructure member.

According to the semiconductor laser device in the embodiment, the oscillated laser light will not leak up to the conductive material formed on the insulator. Generally, the conductive material made of metal is an extremely large optical absorber. However, the above structure prevent such a conductive material from optical absorption, so that internal loss (absorption loss) during laser oscillation is further reduced, thereby making it possible to provide the semiconductor laser device allowing operation with higher efficiency.

In one embodiment of the present invention, a part of the insulator preferably overlaps an edge on the first substructure member and an edge on the second substructure member.

According to the semiconductor laser device in the embodiment, since an insulator is formed between the first and second substructure members so that a part of the insulator overlaps the edge on the first and the second substructure members, the conductive material provided on the insulator can be connected to the first and second substructure members without causing step-like breakage. This makes it possible to obtain the semiconductor laser device with further improved manufacturing yield.

Further, in a semiconductor laser device of one embodiment, the insulator is preferably made of polyimide.

According to the semiconductor laser device of the embodiment, polyimide is not an optical absorption element in itself, and small in scattering loss along the interface with the semiconductor in comparison with other materials (semiconductors or silicon nitride for example).

Also, when a distance between the first substructure member and the second substructure member is formed so as to satisfy D≧W, the second substructure member can be easily designed so as not to exert any harmful influence over the optical confinement characteristic of the semiconductor laser device, as described above. According to a simulation executed under the condition that the space formed between the first and second substructure members is filled with a material, it was proved as a result of calculations that the optical confinement characteristic is hardly influenced even when a refraction index of the material filling the space is increased up to around 2.5. The general refraction index of polyimide is about 1.6 to 1.8. Therefore, the semiconductor laser device with polyimide embedded therein shows a stable optical confinement characteristic. The thickness of a polyimide film formed at the same time also has small influence over the optical confinement characteristic, so that severe control thereof is not required. More particularly, the semiconductor laser device has large manufacturing tolerance, and therefore has benefit of improving manufacturing yield as compared with the cases where other materials are embedded therein.

In one embodiment of the present invention, polyimide preferably has photosensitivity.

According to the semiconductor laser device in the embodiment, by using a polyimide material having photosensitivity, it becomes unnecessary to additionally conducting resist coating for photolithography and etching of the polyimide material. Thereby, the semiconductor laser device can be manufactured at low cost compared with the cases of using other insulating film materials (for example, $SiO_2$, $SiN_x$ and SOG (Spin On Glass)). In this case, positive photosensitivity is more preferable. This is because even when the polyimide is not fully exposed during photolithography since the polyimide is embedded under the shadow of the ridge structure and the like, a necessary part remains after development in the case of positive photosensitivity.

In one embodiment of the present invention, preferably, the current block layer on the second substructure member is GaAs, and the second conductivity-type second etching stop layer is AlGaAs with a composition ratio of Al in III group being 0.5 or more.

According to the semiconductor laser device in the embodiment, by using GaAs for the current block layer and using AlGaAs with a composition ratio of Al in III group being 0.5 or more for the second conductivity-type second etching stop layer, good etching selectivity can be obtained and also the semiconductor layer forming the conductive material is made of GaAs both in the first and second substructure members. Therefore, the degree of its natural oxide formation is considerably smaller than that of an AlGaAs material, thereby allowing for easy achievement of good adhesion to conductive materials.

In one embodiment of the present invention, a metal wire for establishing electric conduction with an outside is preferably connected to the conductive material formed on the second substructure member.

Generally, the conductive material formed on an insulating film is poor in adhesion to the insulating film, and therefore in the wire bonding step for establishing conduction to the outside, there may often occur detachment of the conductive material on the interface between the insulating film and the conductive material. On the other hand, according to the semiconductor laser device in the embodiment, the conductive material is directly formed on the semiconductor layer to offer sufficient adhesion, and therefore detachment will not occur in bonding of a metal wire, allowing for improvement of manufacturing yield.

In order to achieve the above-stated object, the present invention also provides a manufacturing method for a semiconductor device, comprising the steps of:

laminating a main structure member on a first conductivity-type semiconductor substrate, the main structure member having a first etching stop layer in an uppermost portion of the main structure member;

forming one second conductivity-type semiconductor layer or a second conductivity-type semiconductor layer group, in which a plurality of second conductivity-type semiconductor layers are laminated, on the first etching stop layer in the main structure member;

forming a current block layer of a semiconductor layer on the one second conductivity-type semiconductor layer or the second conductivity-type semiconductor layer group;

removing the current block layer to form a stripe shape;

forming a first substructure member whose upper portion has the one second conductivity-type semiconductor layer or the second conductivity-type semiconductor layer group exposed by removing up to the first etching stop layer the second conductivity-type semiconductor layer or group under the both regions in each of which the current block layer is removed in the stripe shape, and forming a second substructure member whose upper portion has a current block layer; and forming a conductive material on the upper portions of the first and second substructure members and between the first and second substructure members.

According to the above-structured manufacturing method for the semiconductor device, the current block layer composed of the semiconductor layer remains on a singularity of the second conductivity-type semiconductor layer or on the second conductivity-type semiconductor layer groups in a region where current injection is not desired. This allows selective current injection and provides a manufacturing method for the semiconductor device which can be manufactured in one crystal growth process. Further, the uppermost portion of both the first substructure member and the second substructure member is formed out of a semiconductor layer. Therefore, the conductive material is structurally formed on the semiconductor layer with sufficient adhesion, which prevents detachment of the conductive material from occurring and allows for improved manufacturing yield. Further, since the first etching stop layer is included in the upper portion of the main structure member, the first substructure member and the second substructure member is controllably formed, which allows easy achievement of stable element characteristics.

In one embodiment of the present invention, the steps of laminating the main structure member to forming the current block layer are preferably performed in a same growth chamber without exposure to an atmosphere.

The term "growth chamber" herein refers to a closed furnace or chamber in growth equipment for crystal growth.

According to the manufacturing method for the semiconductor device in the embodiment, the current block layer is integrally laminated and formed from the beginning in the crystal growth process. Therefore, it is not necessary to additionally perform a step of forming an insulating film or a step of re-growing the current block layer later in a region where current flow is not desired. Thus, a crystal regrowth process with high manufacturing cost is no longer necessary, and shortening of the manufacturing process can be achieved.

In one embodiment of the present invention, preferably, an active layer is formed in the step of laminating the main structure member, and the first substructure member is formed into a ridge portion in the step of forming the first and second substructure members.

According to the manufacturing method for the semiconductor device of the embodiment, it becomes possible to manufacture the semiconductor laser device with use of only one crystal growth process without addition of a separate step of forming an insulating film and the like for blocking current. This allows simplification of the manufacturing process and provides a manufacturing method for the inexpensive semiconductor laser device with improved yield.

In one embodiment of the present invention, the current block layer is preferably a first conductivity-type semiconductor layer in the step of forming the current block layer.

According to the manufacturing method for the semiconductor device in the embodiment, the first conductivity-type semiconductor layer can be sequentially and easily formed in crystal growth on the second conductivity-type semiconductor layer which constitutes a part of the above-stated first substructure member and the second substructure member. Thereby, the current block layer is formed at an extremely low cost. Thus, a manufacturing method for the semiconductor laser device at a lower cost is provided in comparison with the conventional method.

In one embodiment of the present invention, preferably, the manufacturing method for a semiconductor device further comprises the step of:

forming an insulator between the first and second substructure members next to the step of forming the first and second substructure members, wherein the conductive material is integrally formed on the upper portions of the first and second substructure members and on the insulator in the step of forming the conductive material.

According to the manufacturing method for the semiconductor device in the embodiment, the side face of the first substructure member, the exposed surface of the first etching stop layer and the side face of the second substructure member are coated with the insulator. This brings about effects of preventing moisture adsorption and oxidation and providing the method for the semiconductor laser device with high element reliability. Further, since the conductive material is directly formed on the second substructure member, detachment problem in the later-executed wire bonding step is solved.

In one embodiment of the present invention, preferably, the manufacturing method for a semiconductor device further comprises the step of:

applying photosensitive polyimide next to the step of forming the first and second substructure members; and covering edges of the first and second substructure members with a part of a polyimide with use of photolithography method, and filling an interval between the first and second substructure members with the polyimide, wherein the conductive material is integrally formed on the upper portions of the first and second substructure members and on the polyimide in the step of forming the conductive material.

According to the manufacturing method for the semiconductor device in the embodiment, by using a photosensitive polyimide material, the polyimide can be easily filled in the desired space between the first and second substructure members with use of photolithography method. Since it is not necessary to perform additional resist application or removal, deteriorated yield or increased cost due to increase in the number of the manufacturing steps is suppressed, thereby making it possible to provide the manufacturing method for the semiconductor laser device with sufficient yield at low cost.

Further, a part of the polyimide is formed so as to cover the edges of the first and second substructure members, which eliminates failure of step-like breakage of the conductive material formed thereon and improves manufacturing yield. In this case, only a part of the polyimide structurally covers the edges of the first and second substructure members, and therefore, adhesion of the conductive material is not deteriorated.

The present invention provides an optical disk device comprising any one of the semiconductor laser devices as defined above.

According to the optical disk device, it becomes possible to provide the optical disk device which is less expensive than the conventional optical disk device.

The present invention also provides an optical transmission system comprising any one of the semiconductor laser devices as defined above.

According to optical transmission system, it becomes possible to provide the optical transmission module which is less expensive than the conventional optical transmission module, thereby allowing reduction in price of the optical transmission system.

As is clear from the above, according to the semiconductor device, the semiconductor laser device, the manufacturing method for the semiconductor device and the manufacturing method for the semiconductor laser device of the present invention, the semiconductor device can be manufactured in one crystal growth without performing crystal regrowth and the conductive material detachment problem can be suppressed. Therefore, it becomes possible to implement the semiconductor device and the semiconductor laser device which can be manufactured with sufficient yield at low cost.

According to the optical disk device of the present invention, using the semiconductor laser device of the present invention makes it possible to provide the optical disk device which is less expensive than the conventional optical disk device.

According to the optical transmission system of the present invention, using the semiconductor laser device of the present invention in the optical transmission module makes it possible to provide the optical transmission module which is lower in cost than the conventional optical transmission module, thereby allowing reduction in price of the optical transmission system.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2D is a schematic cross sectional view explaining the manufacturing method for the semiconductor laser device following after FIG. 2C;

FIG. 2E is a schematic view explaining a width of a first substructure member and a distance between the first substructure member and a second substructure member of the semiconductor laser device;

FIG. 6D is a schematic cross sectional view explaining the embodiment of the manufacturing method for the ridge waveguide semiconductor laser device following after FIG. 6C;

DETAILED DESCRIPTION OF THE PREFERRED EMBODIMENTS

Detailed description is hereinbelow given of a semiconductor device, a semiconductor laser device, a manufacturing method for a semiconductor device, a manufacturing method for a semiconductor laser device, an optical disk device and an optical transmission system of the present invention in conjunction with the embodiments with reference to the drawings. Description is now given of the embodiments of the present invention.

First Embodiment

Figure 1:
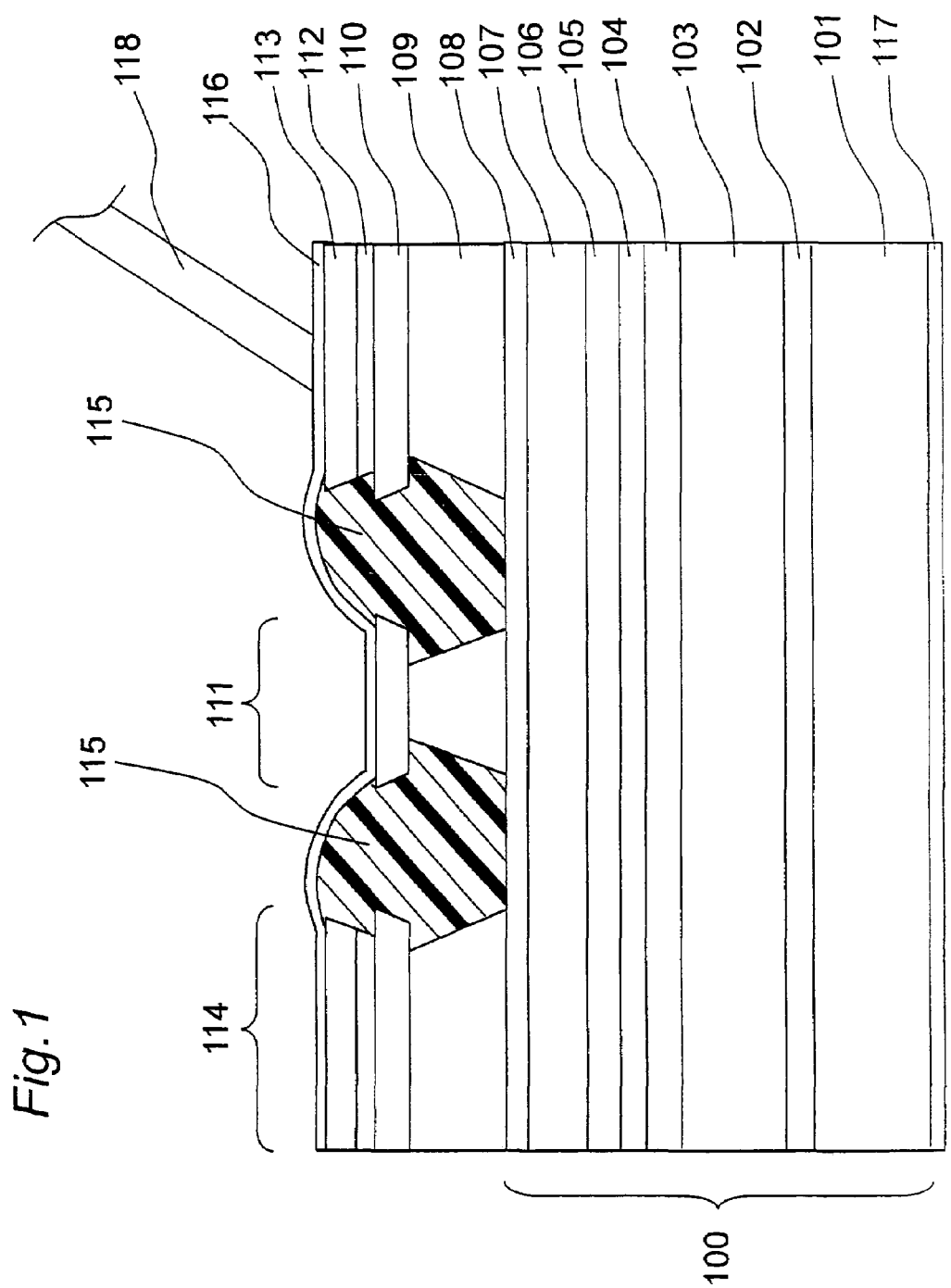
FIG. 1 is a schematic cross sectional view showing a semiconductor laser device in a first embodiment of the present invention.

FIG. 1 is a cross sectional view showing an outlined configuration of a semiconductor laser device as one example of a semiconductor device in a first embodiment of the present invention. In the first embodiment, there is shown an example of the first conductivity type being n type and the second conductivity type being p type. However, the reverse conductivity type arrangement is obviously acceptable.

In the semiconductor laser device, an n-type GaAs buffer layer 102, an n-type $Al_{0.5}Ga_{0.5}As$ lower cladding layer 103, an n-type $Al_{0.4}Ga_{0.6}As$ first optical guide layer 104, a multiple quantum well active layer 105, a p-type $Al_{0.4}Ga_{0.6}As$ second optical guide layer 106, a p-type $Al_{0.5}Ga_{0.5}As$ first upper cladding layer 107 and a p-type GaAs first etching stop layer 108 are sequentially laminated on an n-type GaAs substrate 101 to constitute a main structure member 100. On the main structure member 100, a p-type $Al_{0.5}Ga_{0.5}As$ second upper cladding layer 109 and a p-type GaAs contact layer 110 are laminated in sequence so as to form a first substructure member 111 which is a ridge portion with a width W. Moreover, away from the first substructure member 111 by a distance D, a second substructure member 114 is formed by laminating a p-type $Al_{0.5}Ga_{0.5}As$ second upper cladding layer 109, a p-type GaAs contact layer 110 and a p-type $Al_{0.5}Ga_{0.5}As$ second etching stop layer 112 and an n-type GaAs current block layer 113.

An interval between the first substructure member 111 and the second substructure member 114 is filled with an insulator made of polyimide 115. Portions of the polyimide 115 is formed to overlap an edge of the p-type GaAs contact layer 110 of the first substructure member 111 and an edge of the n-type GaAs current block layer 113 of the second substructure member 114.

The p-side electrode 116 made of a conductive material is formed on the p-type GaAs contact layer 110, the n-type GaAs current block layer 113 and the polyimide 115. The p-side electrode 116 is ohmic-connected to the p-type GaAs contact layer 110 and functions as a p-side electrode 116. On the other hand, an n-side electrode 117 is formed on the back face of the n-type GaAs substrate 101.

A metal wire 118 for p-type electric connection with the outside of the semiconductor laser device is fixed onto the conductive material (i.e. p-side electrode 116) formed on the current block layer 113.

Next, with reference to FIGS. 2A to 2D, a manufacturing method for the semiconductor laser device is described.

First, with use of Metal Organic Chemical Vapor Deposition (MOCVD) method or the like, on the n-type GaAs substrate 101 having (100) plane, there is sequentially formed crystal growth of the n-type GaAs buffer layer 102 (thickness: 0.5 μm, Si dope: $7.2 \times 10^{17}$ $cm^{-3}$), an n-type $Al_{0.5}Ga_{0.5}As$ lower cladding layer 103 (thickness: 1.6 μm, Si dope: $5.4 \times 10^{17}$ $cm^{-3}$), an n-type $Al_{0.4}Ga_{0.6}As$ first optical guide layer 104 (thickness: 0.1 μm, Si dope: $5.4 \times 10^{17}$ $cm^{-3}$), a multiple quantum well active layer 105, a p-type $Al_{0.4}Ga_{0.6}As$ second optical guide layer 106 (thickness: 0.1 μm, Zn dope: $1.35 \times 10^{18}$ $cm^{-3}$), a p-type $Al_{0.5}Ga_{0.5}As$ first upper cladding layer 107 (thickness: 0.32 μm, Zn dope: $1.35 \times 10^{18}$ $cm^{-3}$), a p-type GaAs first etching stop layer 108 (thickness: 40 Å, Zn dope: $2 \times 10^{18}$ $cm^{-3}$), a p-type $Al_{0.5}Ga_{0.5}As$ second upper cladding layer 109 (thickness: 1.28 μm, Zn dope: $2.4 \times 10^{18}$ $cm^{-3}$), a p-type GaAs contact layer 110 (thickness: 0.45 μm, Zn dope: $3 \times 10^{19}$ $cm^{-3}$), a p-type $Al_{0.5}Ga_{0.5}As$ second etching stop layer 112 (thickness: 100 Å, Zn dope: $1 \times 10^{18}$ $cm^{-3}$) and an n-type GaAs current block layer 113 (thickness: 0.6 μm, Si dope: $2.7 \times 10^{18}$ $cm^{-3}$) (see FIG. 2A). The multiple quantum well active layer 105 is formed by alternate disposition of $In_{0.25}Ga_{0.75}As_{0.54}P_{0.46}$ barrier layers (thicknesses from the side of the n-type GaAs substrate 101: 215 Å, 79 Å, 215 Å) and $In_{0.1}Ga_{0.9}As$ quantum well layers (thickness: 46 Å, two layers). The p-type $Al_{0.5}Ga_{0.5}As$ second upper cladding layer 109, the p-type GaAs contact layer 110 and the p-type $Al_{0.5}Ga_{0.5}As$ second etching stop layer 112 constitute a second conductivity-type semiconductor layer group.

Figure 2A:
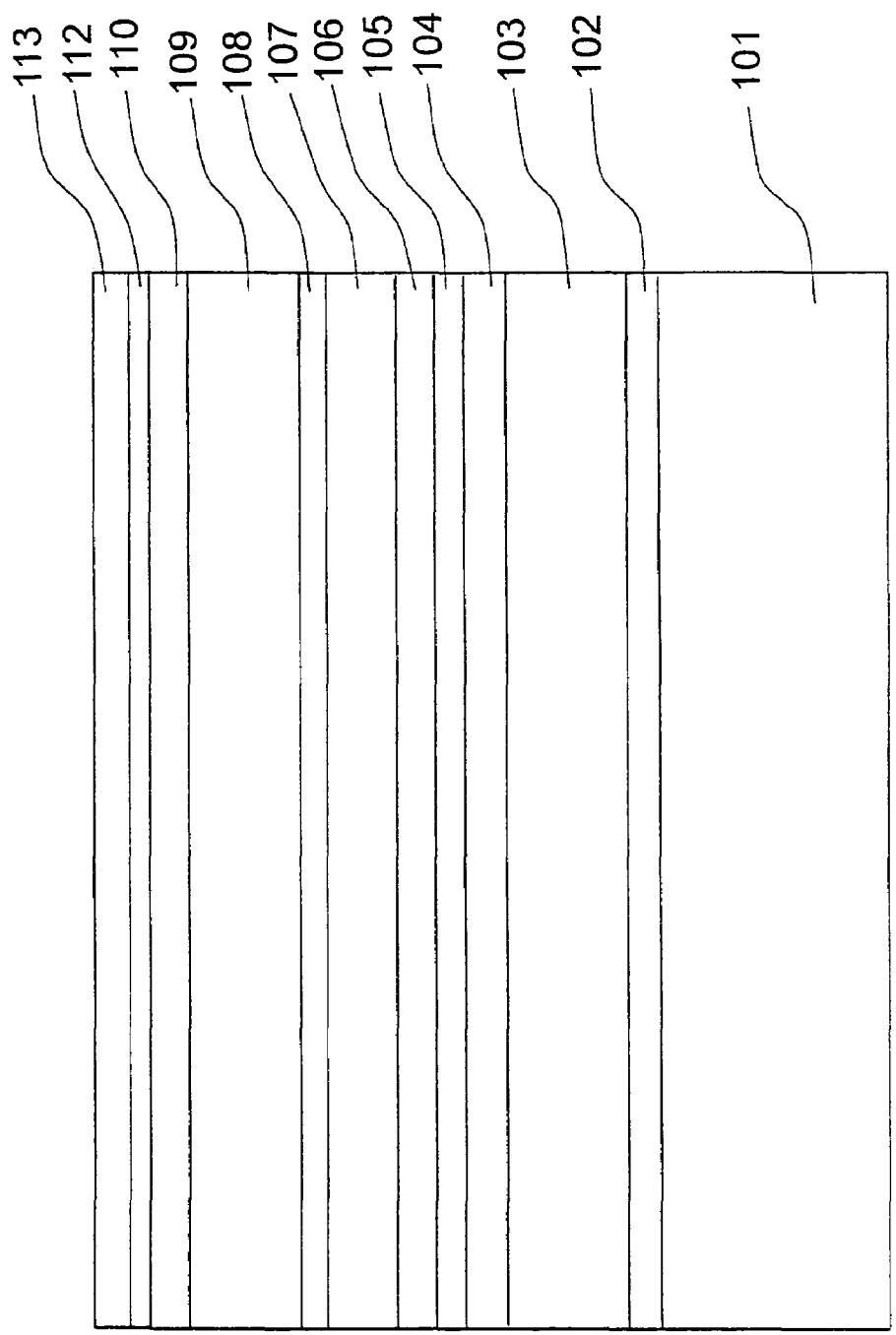
FIG. 2A is a schematic cross sectional view explaining a manufacturing method of the semiconductor laser device.
Figure 2B:
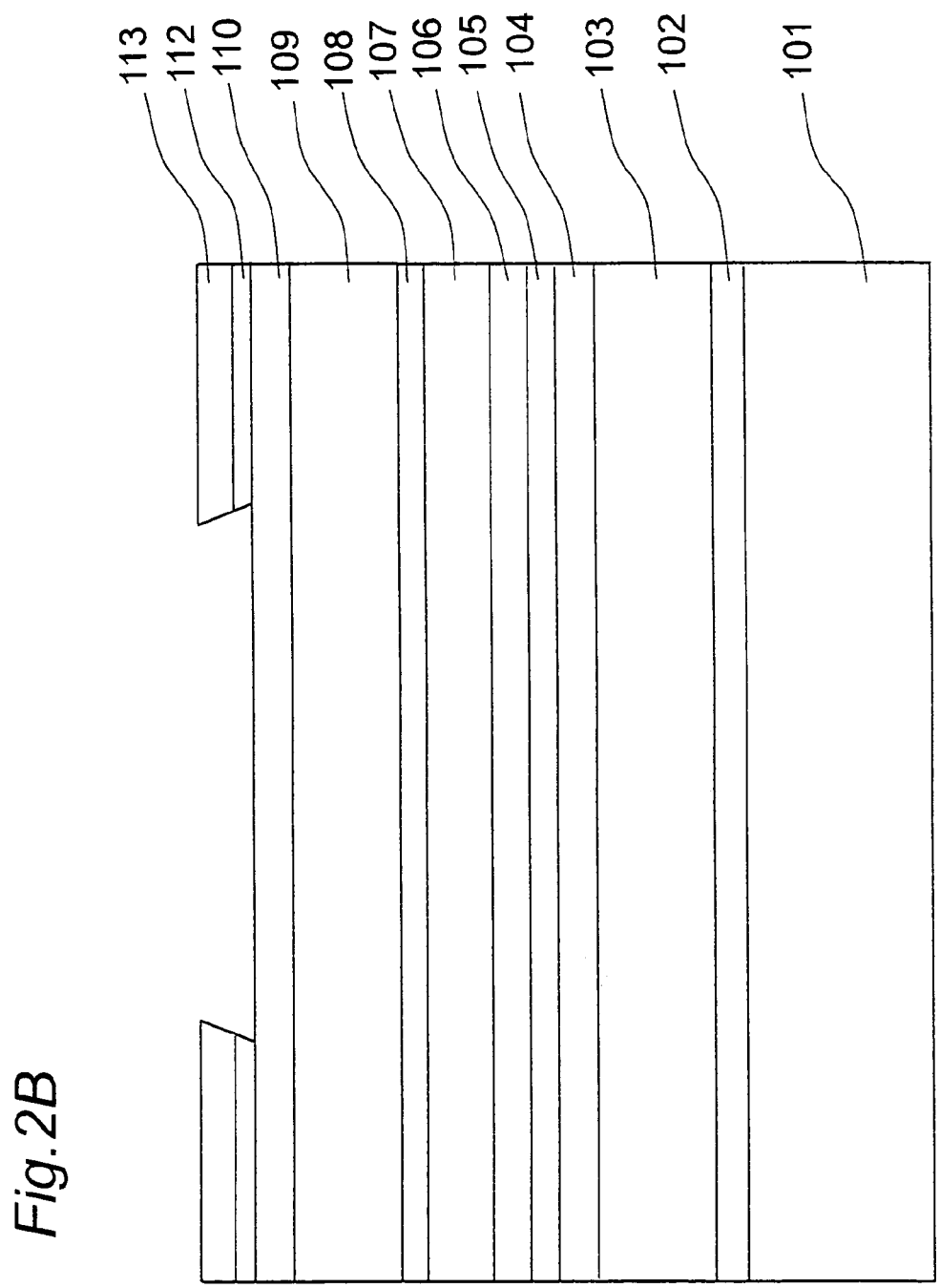
FIG. 2B is a schematic cross sectional view explaining the manufacturing method for the semiconductor laser device following after FIG. 2A.

Next, with use of photolithography method, the n-type GaAs current block layer 113 in the stripe-shape region having 40 μm width is etched away by using sulfuric acid etchant. Then the exposed p-type $Al_{0.5}Ga_{0.5}As$ second etching stop layer 112 is also removed by fluorinated acid etchant so as to expose the p-type GaAs contact layer 110 (FIG. 2B).

Figure 2C:
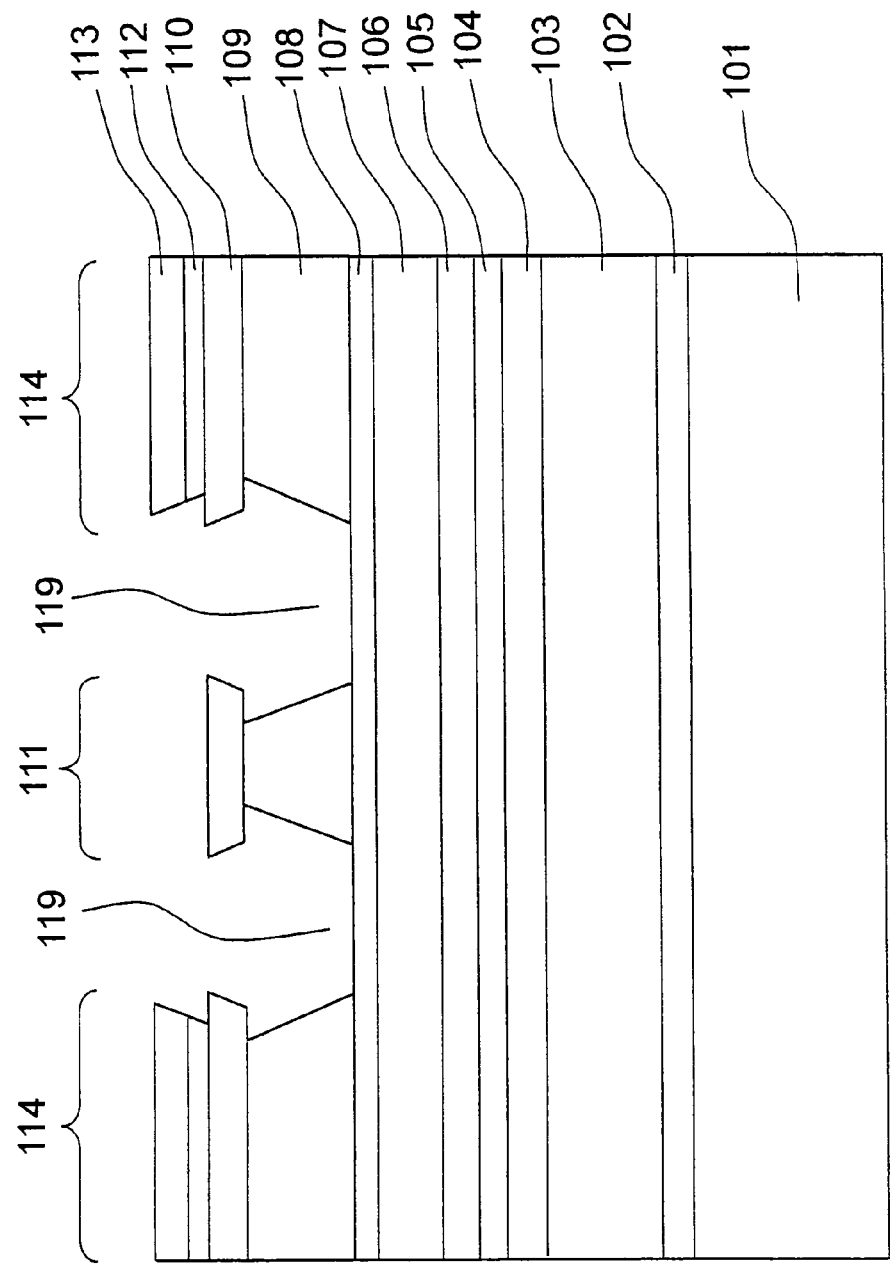
FIG. 2C is a schematic cross sectional view explaining the manufacturing method for the semiconductor laser device following after FIG. 2B.

Next, all the remaining n-type GaAs current block layer 113 and a part of the p-type GaAs contact layer 110 are covered with a resist (unshown) in a stripe shape. Then, etching is further performed to remove the layers up to the p-type GaAs first etching stop layer 108 (FIG. 2C). By this process, the first substructure member 111 and the second substructure member 114 are formed, which members constitute the ridge portion of the semiconductor laser device.

The first and second substructure members 111, 114 are formed so as to satisfy D≧W, where the width of the bottom of the first substructure member 111 is defined as W and an interval between the bottoms of the first and second substructure members 111, 114 is defined as D. In the first embodiment, W is 2.5 μm and D is 15 μm.

Thereafter, the surface of the substrate is spin-coated with a polyimide material having positive photosensitivity. Then, with use of photolithography method, the polyimide material is left between the first and second substructure members 111, 114 in such a way that portions of the polyimide material overlap the edges of both the n-type GaAs current block layer 113 and the p-type GaAs contact layer 110. The shape of FIG. 2D is obtained through imidization by baking. The film thickness of the polyimide material to be applied is determined in consideration of reduction in film thickness by baking in advance.

Next, a p-side electrode 116 (shown in FIG. 1) of Ti (thickness: 500 Å)/Pt (thickness: 500 Å)/Au (thickness: 1000 Å) is formed on the p-type GaAs contact layer 110, the polyimide 115 and the n-type GaAs current block layer 113 by using the electron beam evaporation technique. The n-type GaAs substrate 101 is polished up to a desired thickness. Then, on the back face side thereof, an n-side electrode 117 (shown in FIG. 1) composed of an AuGe (thickness: 1000 Å)/Ni (thickness: 150 Å)/Au (thickness: 1000 Å) is deposited. Though heat treatment, the electrode material is alloyed and ohmic contact is obtained.

Then, the substrate is divided into a desired chip size, and end-face coating (unshown) is undergone. The n-side electrode 117 is mounted on a stem (unshown) with use of an In adhesive paste (unshown). Further, an Au wire 118 is bonded onto the conductive material (p-side electrode 116) formed on the n-type GaAs current block layer 113. Thereby, the semiconductor laser device of the first embodiment is completed (shown in FIG. 1).

The semiconductor laser device of the first embodiment is characterized by two substructure members (first substructure member 111 and second substructure member 114) formed on the first etching stop layer 108 and conductive materials provided on these two substructure members and between these substructure members. In a practical semiconductor laser device, it is easy and preferable to set a distance D between the first substructure member 111 and the second substructure member 114 at about 10 to several tens μm. In this case, a percentage of D to the width of the semiconductor laser device is 10:1 or more. Therefore, most of the conductive materials are directly formed on the first substructure member and the second substructure member. The conductive materials Ti and AuZn generally used for electrodes are good in adhesion to semiconductor materials such as GaAs and the like. Particularly, as in the case of the first embodiment, GaAs is small in the formation degree of natural oxide on the surface and shows good adhesion to general electrode materials as described above. Consequently, the adhesion is considerably enhanced and detachment of the conductive material attributed to poor adhesion is prevented from occurring, compared with conventional ridge waveguide semiconductor laser devices wherein most regions excluding a contact region on the upper part of the ridge portion are covered with an insulating film and conductive materials are formed on the insulating film.

Thus, in the semiconductor laser device of the first embodiment, in order to prevent current from flowing in the regions other than the first substructure member 111 of the ridge portion, the semiconductor laser device has a structure wherein a semiconductor layer for the current block layer is integrally formed from the beginning of the crystal growth thereof, and only a part of the current block layer 113 is removed which part is just above the ridge portion serving as a current injection region. For current blocking, pn junction is utilized. Structurally, a first conductivity-type current block layer is formed on the second conductivity-type semiconductor layer. It is possible to adopt other structures than the above, for example, a structure to provide a wide-gap semiconductor layer having a wide forbidden band width instead of the pn junction. Further, it is also possible to adopt a structure having a second conductivity-type semiconductor layer with doping concentration limited to $1\times10^{17}$ cm$^{-3}$ or lower. In this case, a Schottky junction is formed between the conductive material and the second conductivity-type semiconductor layer with doping concentration of $1\times10^{17}$ cm$^{-3}$ or less so that current block is achieved.

AlGaAs, InGaP, InGaAsP and the like can be used as semiconductor layers without utilizing the pn junction. Among these, use of InGaP and InGaAsP is particularly preferable. This is because use of materials not containing easily oxidizable Al brings about the same effects as those of GaAs described above to improve adhesion to the conductive material, and also because InGaP and InGaAsP themselves have etching selectivity against the GaAs contact layer that forms a top portion of the first substructure member so that it is not necessary to additionally provide a semiconductor layer for stopping etching.

By adopting such structure, it becomes possible to manufacture the semiconductor laser device without additional formation of an insulating film in the current non-injection region and without additional crystal regrowth of a semiconductor layer becoming the current block layer. Further, the electrode detachment problem in the wire bonding step can be prevented by fixing the metal wire, which electrical conducts with the outside, directly to the conductive material formed on the integrally grown current block layer.

In the semiconductor laser device in the first embodiment, as shown in FIG. 2E, the first substructure member 111 and the second substructure member 114 are formed so as to satisfy the relationship of D≧W, where D is the distance between the first substructure member 111 and the current block layer 113, and W is the width of the first substructure member 111 becoming the ridge. The general semiconductor etching technique, regardless of dry or wet one, easily forms a groove with a ratio of pattern remains to no pattern remains being larger than 1:1 as stated above (in the present embodiment, the pattern remains correspond to the first substructure member 111 and the second substructure member 114, no pattern remains correspond to a groove 119 between the first substructure member 111 and the second substructure member 114). In addition, in the case of D≧W, the second substructure member 114 is prevented from exerting influence over optical distribution of a laser light oscillation region immediately under the first substructure member 111, which provides a merit of facilitated optical designing.

Moreover, in the semiconductor laser device of the first embodiment, AlGaAs is used for the lowermost layer of the first substructure member 111 and the second substructure member 114, and GaAs is used for the first etching stop layer 108. The first etching stop layer 108 sometimes becomes an adsorption component of oscillated laser light since the first etching stop layer 108 is close to the active layer. However, in the case of a semiconductor laser device of an oscillation wavelength band 780 nm for example, if the first etching stop layer 108 is formed from GaAs with a thickness of 50 Å or less, then no optical absorption occurs because of a quantum effect and a sufficient selective etching characteristic with respect to AlGaAs is preferably presented. In the semiconductor laser device of longer wavelengths, the thickness restriction required for the first etching stop layer is lowered. In for example 890 nm band, no thickness restriction of GaAs is required.

Generally, the AlGaAs layer is easily oxidized. Once the AlGaAs layer is oxidized, it forms a deep level and makes a nonradiative recombination center. The nonradiative recombination center exerts serious influence over deterioration of current conduction in the element. However, by using GaAs for the first etching stop layer, the first and second substructure members are separately formed and thereafter the main structure member is exposed, the surface of which is GaAs less susceptible to oxidization. This suppresses formation of the nonradiative recombination center in the main structure member near the active layer, so that element reliability is increased.

Further, the semiconductor laser device of the first embodiment has such a structure that the second conductivity-type second etching stop layer 112 made of AlGaAs is provided immediately under the first conductivity-type current block layer 113 made of GaAs. Thus, providing the second conductivity-type second etching stop layer 112 on the lower side of the current block layer 113 makes it easy to remove the current block layer, which is the first stage of the ridge portion formation, and therefore manufacturing yield is improved. Particularly, a general sulfuric acid etchant can controllably remove the current block layer 113 from the region forming the ridge portions when GaAs is used for the current block layer 113 and when AlGaAs, which has a mixed crystal ratio more than 0.5 of Al in III group, is used for the second etching stop layer 112, as in the case of the first embodiment. Of course, without additionally providing a second etching stop layer, AlGaAs may be used for the current block layer and the AlGaAs current block layer may be removed by fluorinated acid etchant. In this case, use of AlGaAs materials widens the forbidden bandwidth, which brings about a merit that current is more easily blocked. However, because of the difference in easy formation of natural oxide, good adhesion is obtained when the conductive material is formed on the GaAs current block layer rather than the AlGaAs current block layer.

Further, in the semiconductor laser device of the first embodiment, an insulator (polyimide 115) is filled between the first substructure member 111 and the second substructure member 114. As shown in FIG. 1, the insulator is higher than the first substructure member, and at least a part of the insulator is higher than the second substructure member. This prevent oscillated laser light from leaking into the conductive material formed on the insulator. Generally, the conductive material made of metal is an extremely large optical absorber. However, the above-stated structure prevents such optical absorption, so that internal loss (i.e. absorption loss) during laser oscillation is greatly reduced.

Further, in the semiconductor laser device of the first embodiment, polyimide is used for material of an insulator embedded in a groove 119 (shown in FIG. 2E) between the first substructure member 111 and the second substructure member 114. Thus, the side faces of the first substructure member 111 and the top surfaces of the first etching stop layer 108 in the vicinity of the first substructure member 111 are prevented from being exposed to the atmosphere etc. Thereby, moisture absorption and progress of natural oxidation are prevented, which brings about effects of improving reliability of the semiconductor laser device.

In the semiconductor laser device of the first embodiment, polyimide used for the insulator is normally has a refraction index of about 1.6 to 1.8. A simulation of optical distribution proved that almost no influence is exerted over the optical distribution characteristic by material having the refraction index of up to about 2.5, which material is embedded beside the first substructure member 111 in this embodiment. Also, it was found out that almost no influence over the optical distribution characteristic is exerted by changes in film thickness of the material having the refraction index of 1.6 to 1.8 when the material having a refraction index of 1.6 to 1.8 is embedded up to about the same height as the first substructure member 111 forming the ridge portion. Consequently, in the constitution of the first embodiment, variations in the polyimide embedding step exercises almost no influence on the element characteristics. This makes it possible to obtain the semiconductor laser device having a large manufacturing tolerance.

The polyimide to which photosensitivity is added is used in the semiconductor laser device of the first embodiment. This eliminates the necessity of executing steps of developing, exposing and polyimide etching by a resist film additionally after formation of a polyimide film. Thereby, the manufacturing process is shortened and yield is improved.

Further, in the semiconductor laser device of the first embodiment, a part of the insulator made of polyimide is formed to overlap an edge on the first substructure member and an edge on the second substructure member. This allows the conductive material provided on the insulator to connect the first and second substructure members without causing step-like breakage, which contributes to improvement of manufacturing yield.

Further in the manufacturing method for the semiconductor laser device of the first embodiment, a polyimide having positive photosensitivity is used as photosensitive polyimide. Otherwise, in exposing a desired pattern, it is difficult to expose the polyimide embedded in the region immediately under a visor-shaped portion of the p-type GaAs contact layer 110 in FIG. 2D, that is to say, in the region under the shadow of the visor. On the other hand, in the case that the polyimide is positive, only the portion immediately above the first substructure member 111 and the portion immediately above the second substructure member 114 should be exposed.

Further, in patterning the polyimide material by photolithography, it is preferable to use a photo mask having such a pattern as to avoid forming of the polyimide material in the vicinity of the region where end-face cleavage of the semiconductor laser device is performed. This makes it possible to prevent occurrence of burr, which is caused by forceful cleavage of the polyimide-embedded portion which has no cleavage plane, and occurrence of failure generated thereby at the time of end-face cleavage.

Further, according to the manufacturing method for the semiconductor laser device of the first embodiment, it is possible to selectively inject current by remaining the current block layer 113 on the second conductivity-type semiconductor layer located in the region where current injection is not desired. Also, the conductive material is formed on the semiconductor layer, so that sufficient adhesion therebetween is obtained and the detachment problem of conductive material is avoided, which contributes to improvement of manufacturing yield. Further, since the first etching stop layer 108 is included in the upper portion of the main structure 100, it is possible to controllably form the first substructure member 111 and the second substructure member 114, thereby allowing for easy achievement of stable element characteristics.

Further, the steps of laminating the main structure member 100 to forming the current block layer 113 are performed in a same growth chamber without exposure to the atmosphere. Thereby, the current block layer 113 is laminated or formed, integrated with the main structure member 100 from the beginning of the crystal growth process. Therefore, it is not necessary to perform additional steps of forming an insulating film and re-growing the current block layer later in the region where current flow is not desired. Therefore, a crystal regrowth process with high manufacturing cost is no longer necessary, and shortening of the manufacturing process is achieved.

Further in the manufacturing method of the semiconductor laser device of the first embodiment, patterning is performed in such a way that parts of the polyimide covers the edges of the first and second substructure members 111, 114 and then imide formation is performed by baking. The baking makes the corners of the polyimide round so that the space between the first and second substructure members 111, 114 can be smoothly filled with the polyimide. Thereby, the conductive material formed thereon is prevented from any step-like breakage. Further, since there is no step between the embedded polyimide and the first substructure member 111 or the second substructure member 114, it is no longer necessary to increase the thickness of the conductive material excessively for prevention of step-like breakage. This makes it possible to economize the conductive material formed by deposition. In the first embodiment, the step-like breakage does not occur though the conductive material is formed to have a total thickness of 2000 Å.

Figure 3:
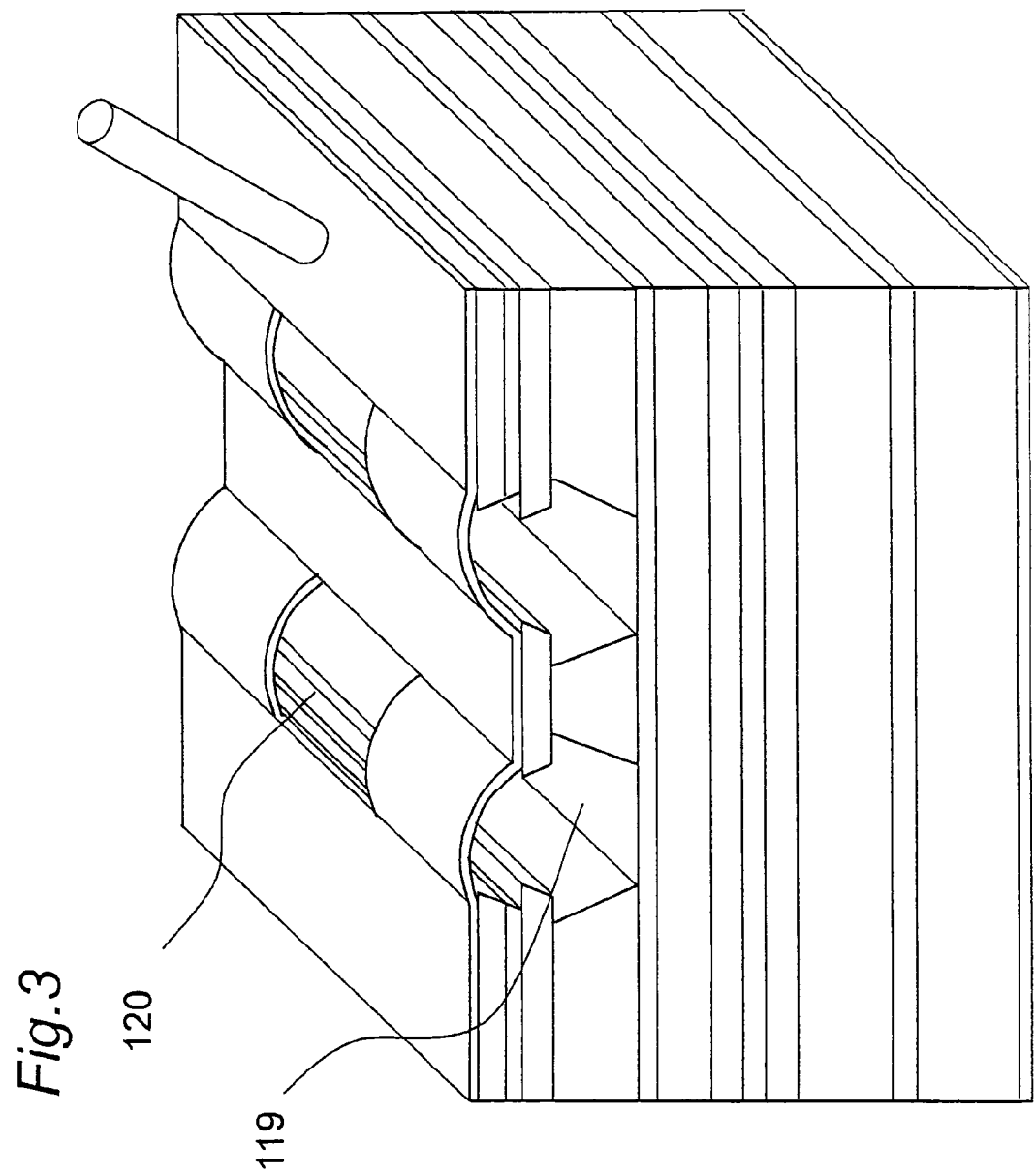
FIG. 3 is a perspective view showing a modified example of the semiconductor laser device in the first embodiment.

It goes without saying that the insulator should not be necessarily embeded in the groove 119 as in the case of the first embodiment. FIG. 3 shows a modified example of the semiconductor laser device of the first embodiment manufactured by using the so-called air-bridge technique.

In FIG. 3, when the conductive material is formed, a resist material removed later is embedded in the groove 119. Then, in order to easily remove the resist material after formation of the conductive material, an electrode pattern having aperture regions 120 in places is formed on the groove 119 by using lift-off method. Then, the resist material embedded in the groove 119 is removed by solvent and the like, so that the semiconductor laser device as shown in FIG. 3 can be obtained.

As described above, according to the semiconductor laser device and the manufacturing method therefor in the first embodiment, a plurality of crystal growth processes are not required, and also there is no problem with regard to detachment of the conductive material for forming the electrode. Consequently, these allow the semiconductor laser device and the manufacturing method therefor to be provided at low cost with sufficient yield.

Second Embodiment

Figure 4:
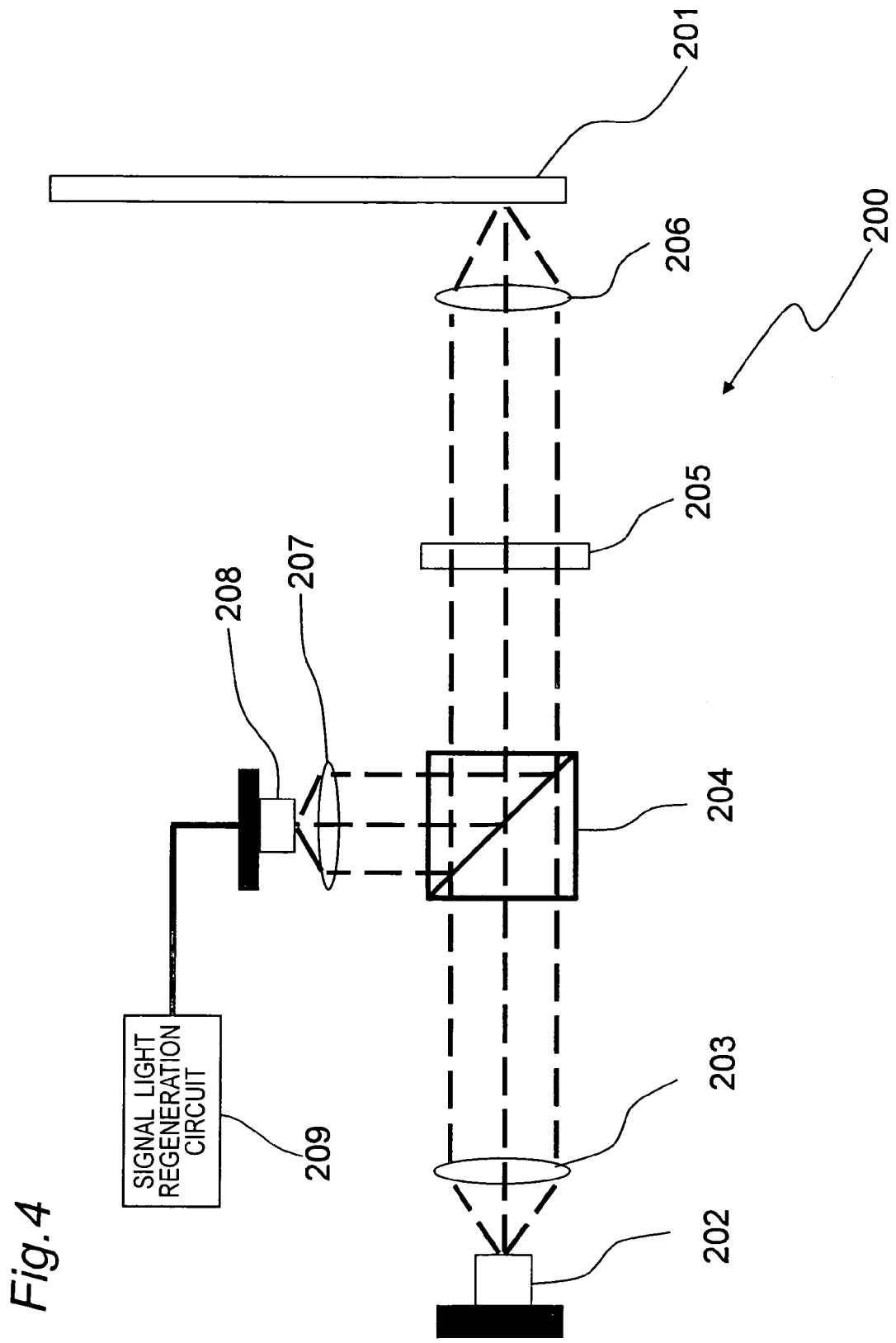
FIG. 4 is a schematic view showing an optical disk device in a second embodiment of the present invention.

FIG. 4 shows one example of the structure of an optical disk device 200 according to the present invention. The optical disk device is for writing data onto an optical disk 201 and reproducing the written data. The optical disk device 200 has a semiconductor laser element 202 oscillating in 780 nm band as a light-emitting element, which is made by using the structure and the manufacturing method in the first embodiment of the present invention described before.

More detailed description is given of the optical disk device. In writing operation, signal light emitted from the semiconductor laser element 202 is formed into parallel light by a collimate lens 203. The signal light passes a beam splitter 204. Then, a λ/4 polarizing plate 205 adjusts the polarized state of the signal light. Thereafter, the signal light is collected by a laser irradiation object lens 206 and is radiated to the optical disk 201. In reading operation, laser light carrying no data signal is radiated to the optical disk 201 by way of the same path as that in the writing operation. The laser light is reflected by the surface of the optical disk 201 on which data is recorded. The reflected laser light passes the laser irradiation object lens 206 and the λ/4 polarizing plate 205. Thereafter, the light is reflected by the beam splitter 204 and its angle is changed 90°. Then, the light is collected by a light-receiving element object lens 207 and comes incident to a signal detection light-receiving element 208. In the signal detection light-receiving element, data signals are converted to electric signals, where data signals are recorded by changes in the intensity of incident laser light. Finally, original signals are regenerated in a signal light regeneration circuit 209.

The optical disk device according to the second embodiment is produced at lower cost than the conventional devices. This is because the optical disk device uses the semiconductor laser element as described above, which element can be produced in one crystal growth process, free from the electrode detachment problem in the wire bonding, and further obtain a desired optical characteristic with sufficient reproducibility.

Thus far, description has been give of the example of applying the semiconductor laser element of the present invention to a record reproduction-type optical disk device. However, it should be naturally understood that the above-stated semiconductor laser element may also be applied to an optical disk recorder and an optical disk reproducer which use the same 780 nm wavelength band, and an optical disk device for other wavelength bands than 780 nm (e.g., 650 nm band).

Third Embodiment

Figure 5A:
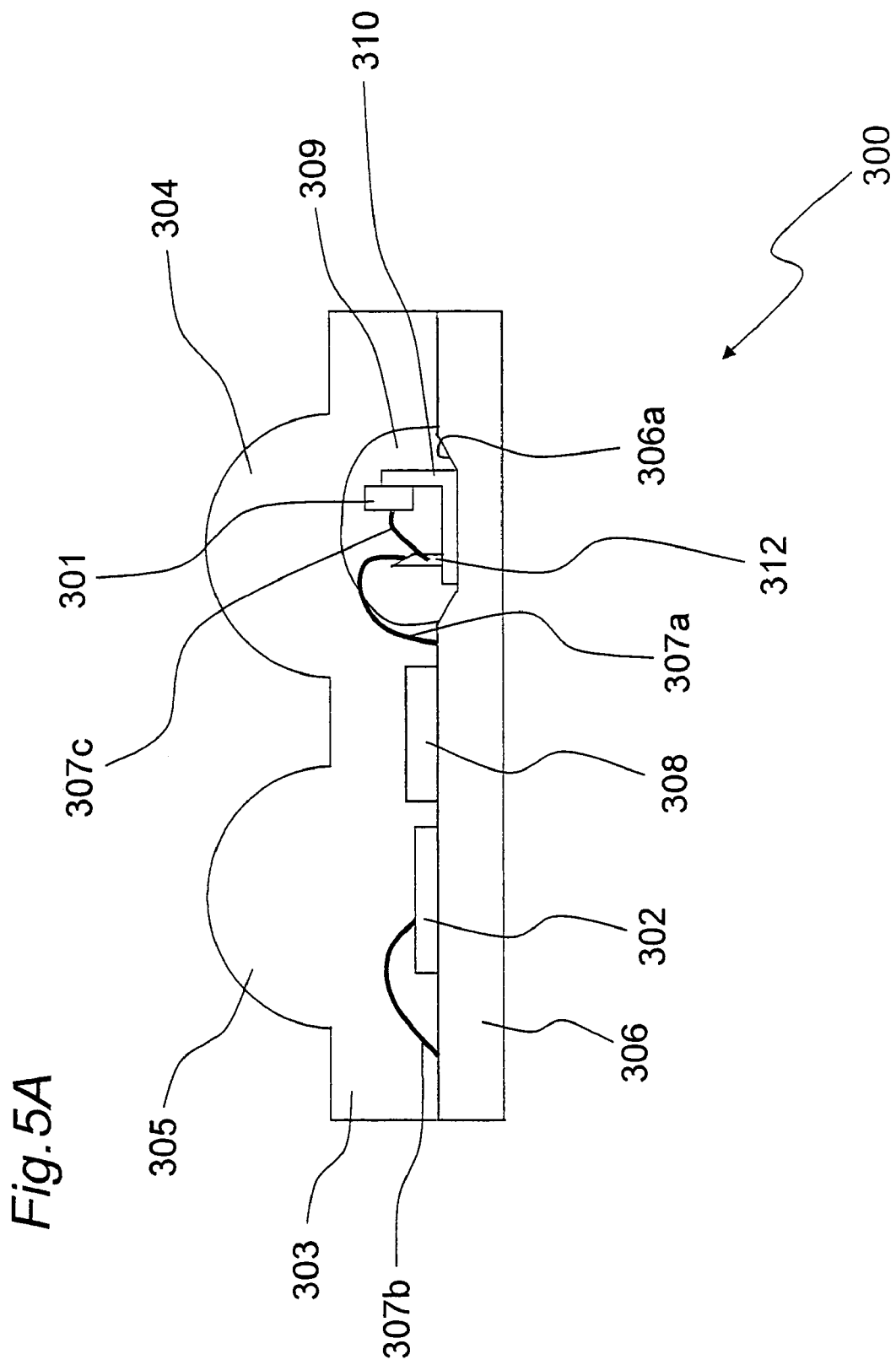
FIG. 5A is a schematic view showing an optical module for use in an optical transmission system in a third embodiment of the present invention.
Figure 5B:
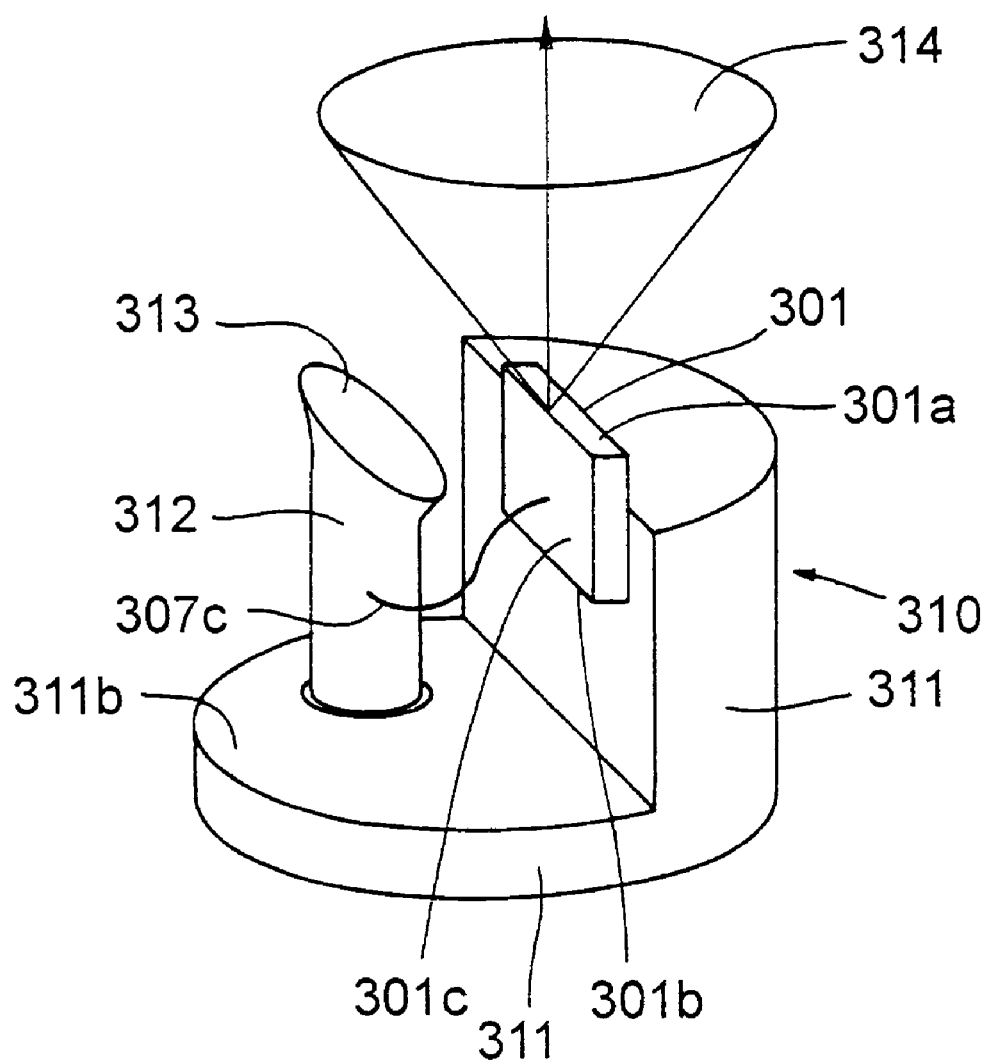
FIG. 5B is a perspective view showing a light source section of the optical transmission module.

FIG. 5A is a cross sectional view showing an optical transmission module 300 in an optical transmission system in a third embodiment of the present invention. FIG. 5B is a perspective view showing a light source section of the optical transmission module. In the third embodiment, an InGaAs semiconductor laser element (laser chip 301) with an oscillation wavelength of 890 nm described in the first embodiment is used as a light source, and a silicon (Si) pin photodiode is used as a light-receiving element 302. As described in detail later, the optical transmission module 300 is provided on both ends of communication (e.g., terminal and server) so as to structure an optical transmission system for sending and receiving optical signals between both the optical transmission modules 300.

In FIG. 5A, both positive and negative electrode patterns for driving a semiconductor laser are formed on a circuit board 306. As shown in the drawing, a 300 μm-deep recess portion 306a is formed in a mounting portion for the laser chip. A laser mount (mount material) 310 incorporating the laser chip 301 is soldered to the recess portion 306a. A planar portion 313 (shown in FIG. 5B) of a positive electrode 312 on the laser mount 310 is electrically connected to a laser driving positive electrode portion (unshown) on the circuit board 306 via a wire 307a. The recess portion 306a is deep enough so as not to disturb radiation of laser light, and the surface roughness is arranged so as for not to affect a radiation angle.

The light-receiving element 302 is also mounted on the circuit board 306. Electric signals are extracted by a wire 307b. In addition to these, an IC circuit 308 for laser driving/reception signal processing is mounted on the circuit board 306.

Next, an appropriate quantity of liquid silicon resin 309 is delivered by drops into a portion where the laser chip 301 is soldered to the recess portion 306a to be mounted thereon. The silicon resin 309 remains in the recess portion 306a due to surface tension, so that the silicon resin 309 covers the laser mount 310 and fixes it to the recess portion 306a. In the third embodiment, the recess portion 306a is provided on the circuit board 306 and the laser mount 310 is mounted thereon. However, the recess portion need not necessarily be provided because the silicon resin 309 remains on the surface of the laser chip and the vicinity thereof due to surface tension as stated above.

After that, the silicon resin 309 is hardened to become jelly-like by heating it for 5 minutes at 80° C. Next, the board is coated with a transparent epoxy resin mold 303. A lens portion 304 for controlling a radiation angle and a lens portion 305 for collecting signal light are integrally formed as mold lenses on the upper surface of the laser chip and on the upper surface of the laser-receiving element, respectively.

Description is now given of the laser mount 310 with reference to FIG. 5B. As shown in FIG. 5B, the laser chip 301 is die-bonded to an L-shaped heat sink 311 by using an In adhesive. The laser chip 301 is the InGaAs semiconductor laser element described in the first embodiment. A laser chip lower face 301b is coated with a high-reflection film, while a laser chip upper face 301a is coated with a low-reflection film. These reflection films serve also for protecting the laser chip end faces.

The positive electrode 312 is fixed onto a base portion 311b of the heat sink 311 via an insulator so as to avoid electric conduction to the heat sink 311. The positive electrode 312 and a p-side electrode 301c on the surface of the laser chip 301 are connected by a gold wire 307c. As described above, the laser mount 310 is soldered to the negative electrode (unshown) of the circuit board 306 of FIG. 5A, and the wire 307a connects the planar portion 313 on the upper portion of the positive electrode 312 to the positive electrode portion (unshown) of the circuit board 306. The optical transmission module 300, which produces a laser beam 314 by oscillation, is completed by forming such interconnections.

The optical transmission module 300 of the third embodiment uses the semiconductor laser element which can be produced in one crystal growth process as described above. Therefore, the semiconductor laser element is free from the electrode detachment problem in the wire bonding, and which can further obtain a desired optical characteristic with sufficient reproducibility. Thus, it becomes possible to hold down the cost in module production compared to the conventional case, thereby making it possible to provide the inexpensive optical transmission system.

Figure 5C:
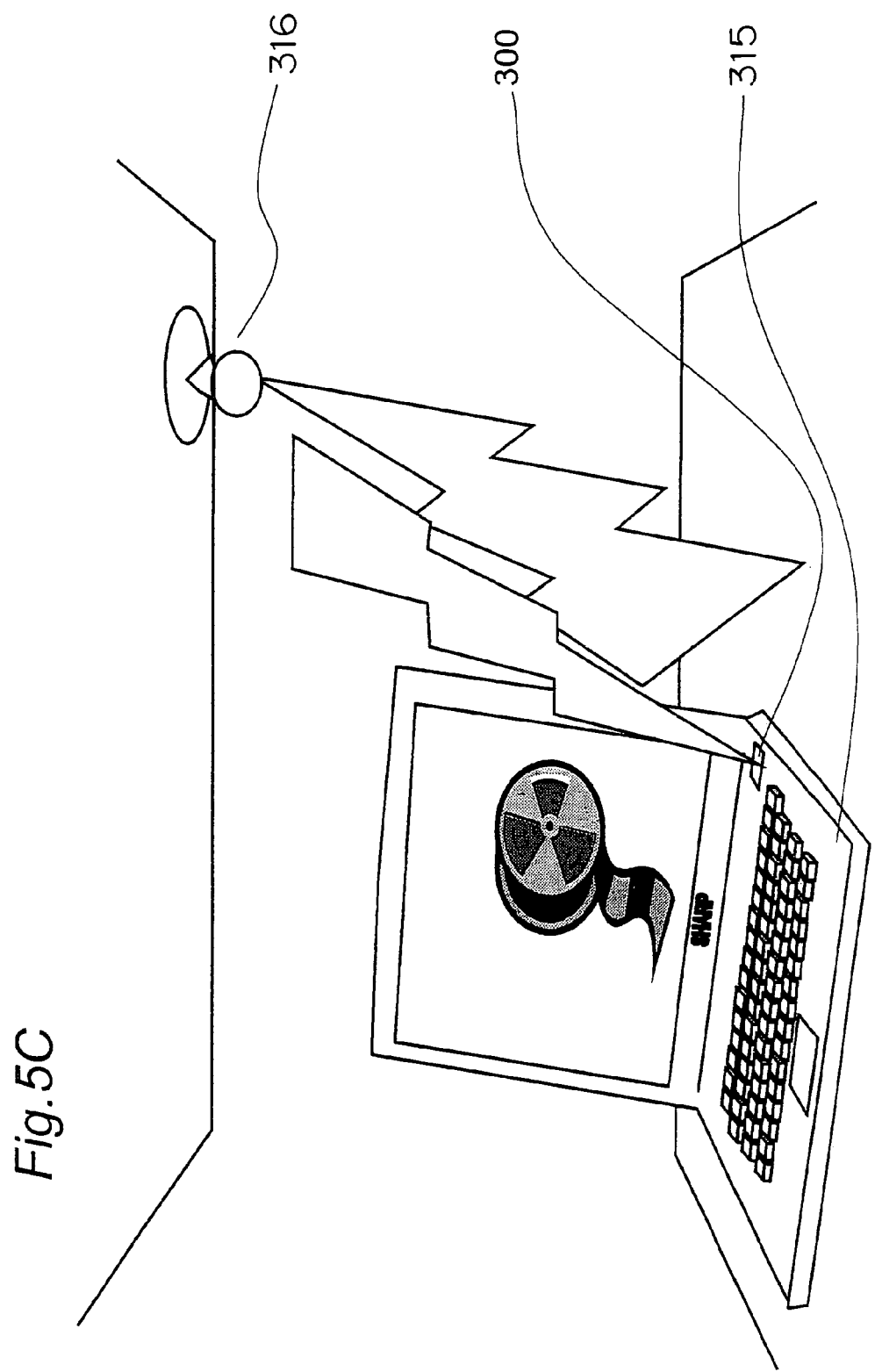
FIG. 5C is a schematic view explaining the optical transmission system.
Figure 6A:
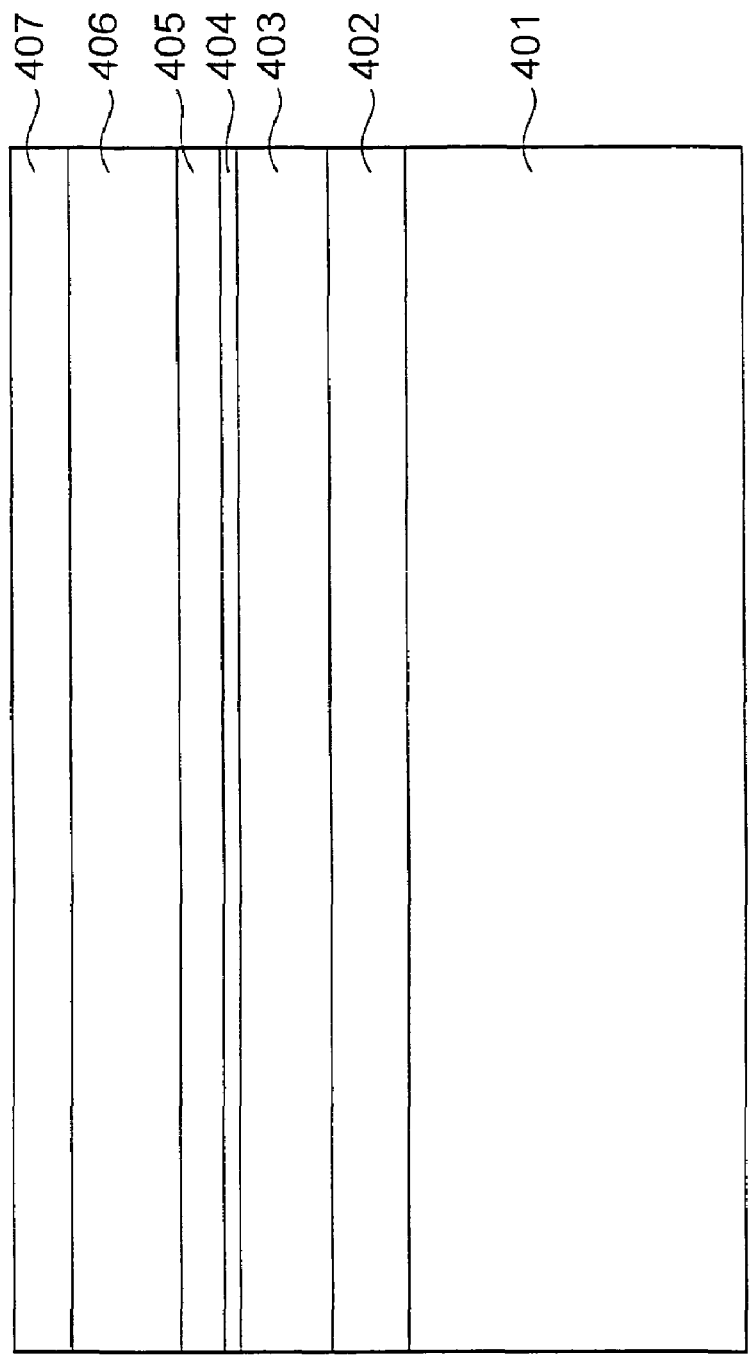
FIG. 6A is a schematic cross sectional view explaining an embodiment of a conventional manufacturing method for a ridge waveguide semiconductor laser device.
Figure 6B:
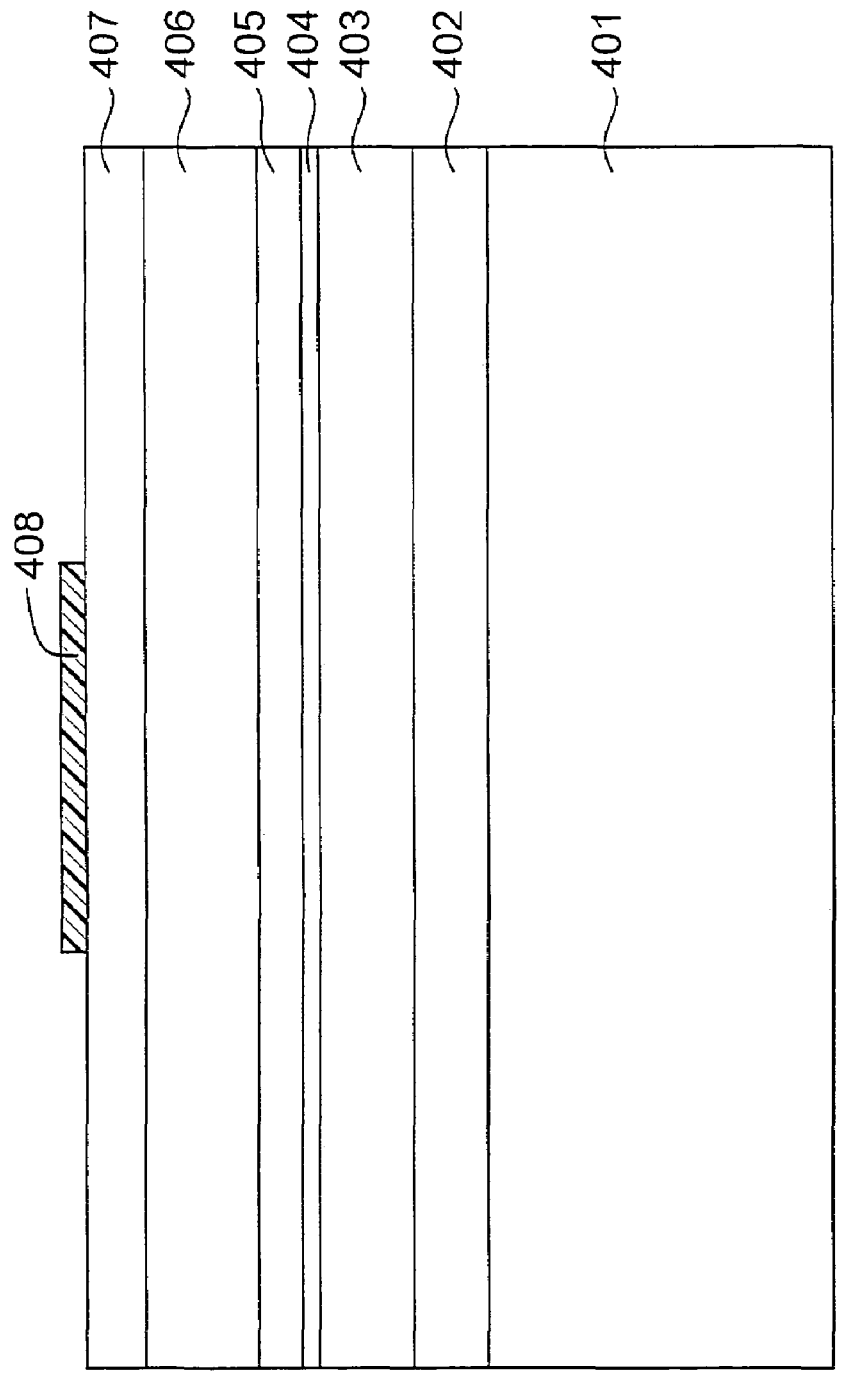
FIG. 6B is a schematic cross sectional view explaining the embodiment of the manufacturing method for the ridge waveguide semiconductor laser device following after FIG. 6A.
Figure 6C:
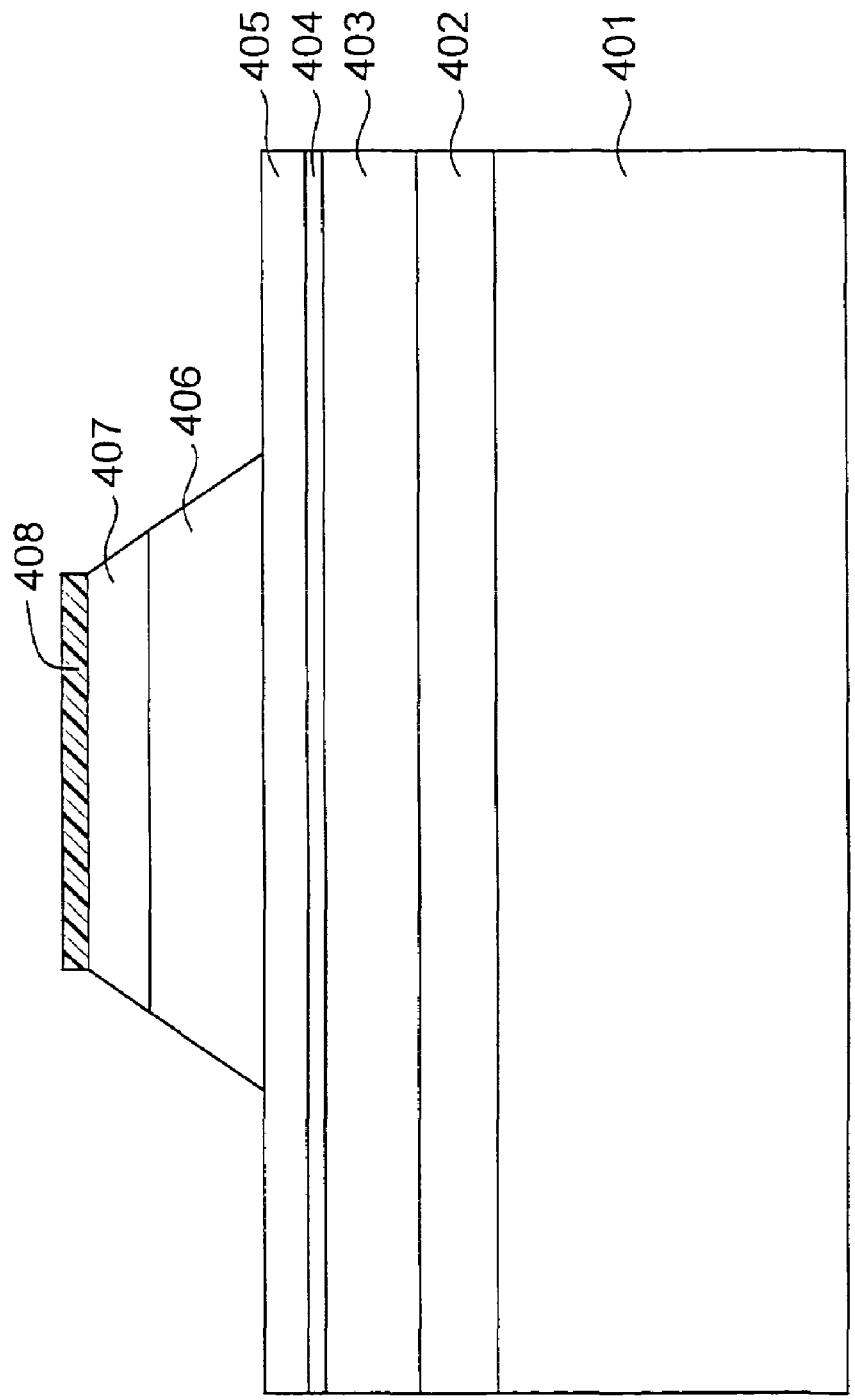
FIG. 6C is a schematic cross sectional view explaining the embodiment of the manufacturing method for the ridge waveguide semiconductor laser device following after FIG. 6B.
Figure 6E:
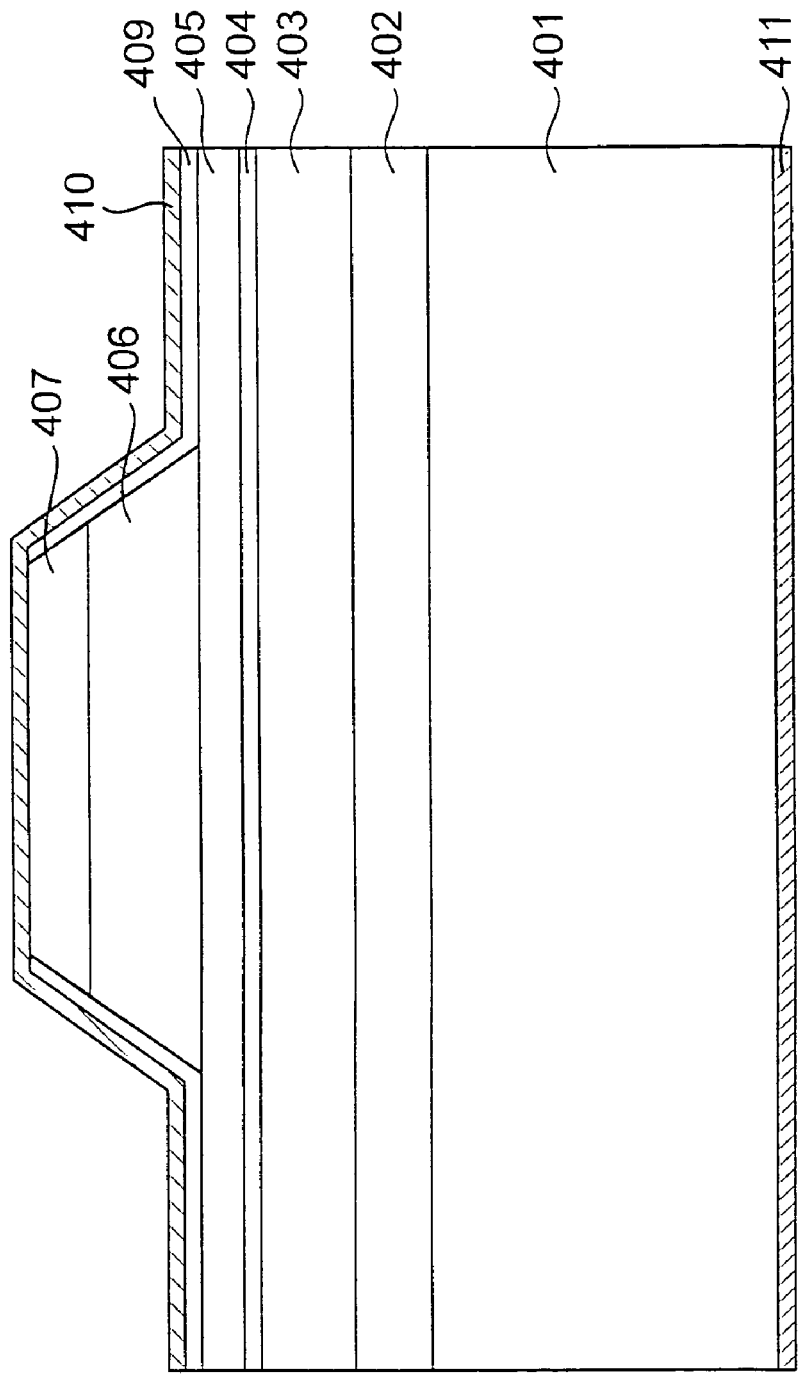
FIG. 6E is a schematic cross sectional view explaining the embodiment of the manufacturing method for the ridge waveguide semiconductor laser device following after FIG. 6D.
Figure 7:
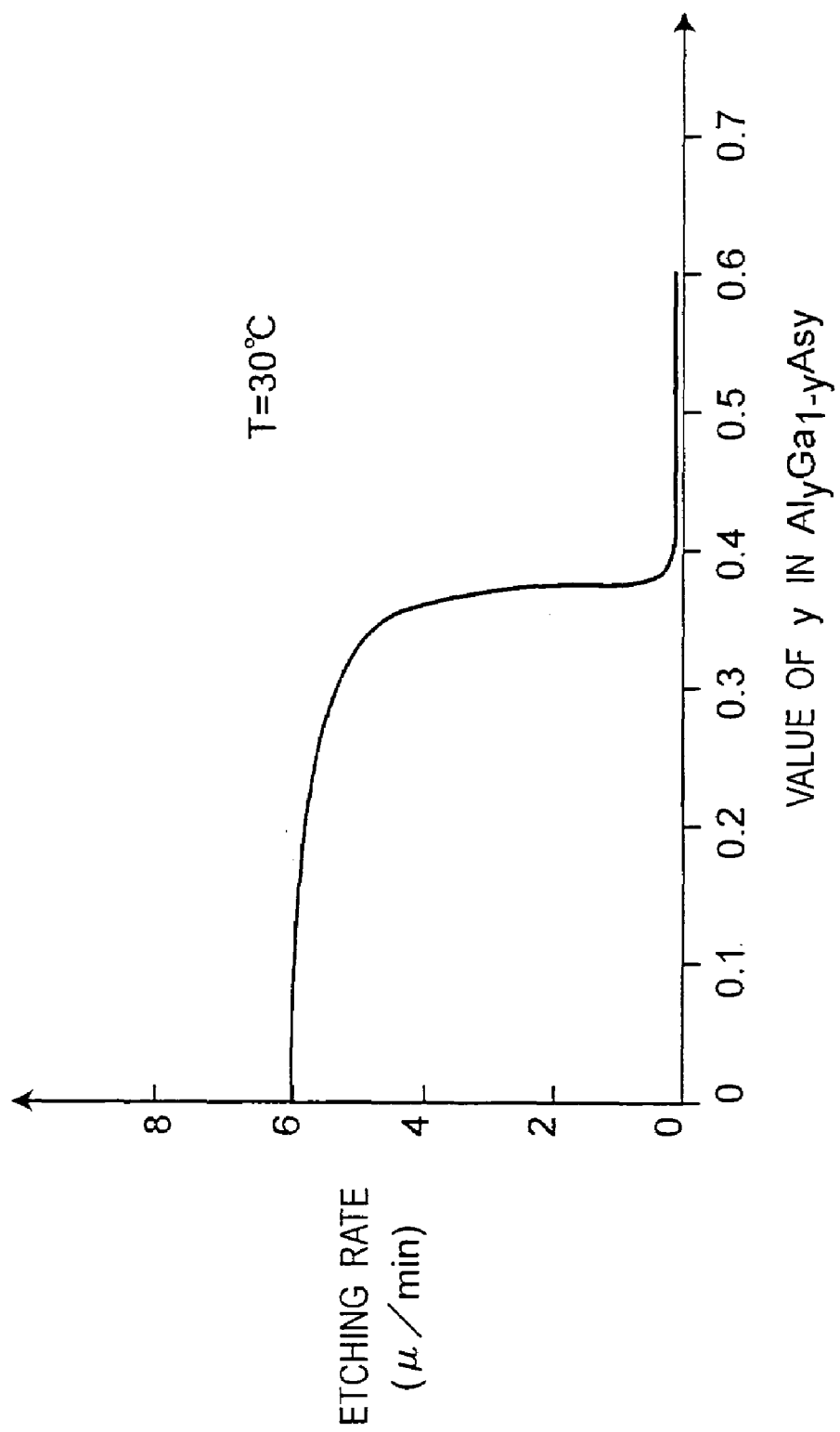
FIG. 7 is a view showing composition dependence of an etching rate of $NH_4OH:H_2O_2=20:1$ solution.

As described above, by providing the identical optical transmission module 300 on both ends of communication, the optical transmission system for sending and receiving optical signals between both the optical transmission modules 300 is constituted. FIG. 5C shows a configuration example of the optical transmission system using the optical transmission module 300. The optical transmission system is composed of the optical transmission module 300 in a base station 316 disposed on the ceiling of a room and the same optical transmission module (denoted by reference numeral 300' for distinction) in a personal computer 315. An optical signal carrying data, which is emitted from a light source of the optical transmission module 300' of the personal computer 315, is received by a light-receiving element in the optical transmission module 300 of the base station 316. On the other hand, a light signal emitted from a light source of the optical transmission module 300 of the base station 316 is received by a light-receiving element in the optical transmission module 300' of the personal computer 315. Thus, optical (infrared ray) data communication is implemented.

It should be understood that the semiconductor device, the semiconductor laser device, the optical transmission system and the optical disk device according to the present invention are not limited to the above-stated embodiments, but numerous modifications may be added without departing from the spirit of the invention, for example, modifications in layer thickness and layer number of the well layer and barrier layer.

Description has been given of the semiconductor laser device as one example of the semiconductor device and the manufacturing method therefor in the first embodiment. However, the semiconductor device is not limited thereto, and the present invention may be applied to other semiconductor devices such as field effect transistors.

In the first embodiment of the present invention, the second conductivity-type semiconductor layer group is constituted by the p-type $Al_{0.5}Ga_{0.5}As$ second upper cladding layer 109, the p-type GaAs contact layer 110 and the p-type $Al_{0.5}Ga_{0.5}As$ second etching stop layer 112 laminated on the main structure member 100. However, the present invention may be applied to a semiconductor laser element where a single second conductivity-type semiconductor layer is formed on the main structure member.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A semiconductor device, comprising:
 a main structure member laminated on a first conductivity-type semiconductor substrate;
 a first substructure member which is formed on the main structure member, the first substructure member consisting of a plurality of semiconductor layers of a second conductivity-type;
 a second substructure member which is formed on the main structure member in the state of being spatially separated from the first substructure member, the second substructure member comprising said plurality of semiconductor layers of the second conductivity-type and a current block layer comprising a semiconductor layer as an uppermost layer of the second substructure member; and
 a conductive material which is formed on and in contact with an upper surface of the first substructure member and on and in contact with an upper surface of the current block layer of the second substructure member such that the first and second substructure members are connected.

2. The semiconductor device as defined in claim 1, wherein
 the semiconductor device is a semiconductor laser device in which the main structure member has an active layer and the first substructure member is a ridge portion.

3. The semiconductor laser device as defined in claim 2, wherein
 the current block layer is the first conductivity-type semiconductor layer.

4. The semiconductor laser device as defined in claim 2, wherein
 the current block layer is the second conductivity-type semiconductor layer, and
 the second conductivity-type semiconductor layer has a doping concentration of not more than $1\times10^{17}$ cm$^{-3}$.

5. The semiconductor laser device as defined in claim 2, wherein
 a first etching stop layer is formed in an uppermost portion of the main structure member, and
 the second conductivity-type semiconductor layer formed in the lowermost layer of the first and second substructure members allows selective etching against the first etching stop layer.

6. The semiconductor laser device as defined in claim 2, wherein
 the second substructure member has a second etching stop layer of a second conductivity-type semiconductor under the current block layer, and
 the current block layer allows selective etching against the second conductivity-type second etching stop layer.

7. The semiconductor laser device as defined in claim 2, wherein
 $D \geq W$ is satisfied
 where a width of the first substructure member is W, and a distance between the first substructure member and the second substructure member is D.

8. The semiconductor laser device as defined in claim 2, wherein
 a space between the first and second substructure members is filled with an insulator.

9. The semiconductor laser device as defined in claim 8, wherein
 a height of the insulator is higher than that of the first substructure member and a height of at least a part of the insulator is higher than that of the second substructure member.

10. The semiconductor laser device as defined in claim 8, wherein
 a part of the insulator overlaps an edge on the first substructure member and an edge on the second substructure member.

11. The semiconductor laser device as defined in claim 8, wherein
 the insulator is polyimide having photosensitivity.

12. The semiconductor laser device as defined in claim 6, wherein
 the current block layer on the second substructure member is GaAs, and
 the second conductivity-type second etching stop layer is AlGaAs with a composition ratio of Al in III group being 0.5 or more.

13. The semiconductor laser device as defined in claim 2, wherein
 a metal wire for establishing electric conduction with an outside is connected to the conductive material formed on the second substructure member.

14. An optical disk device comprising the semiconductor laser device as defined in claim 2.

15. An optical transmission system comprising the semiconductor laser device as defined in claim 2.

* * * * *